(12) United States Patent
Miyahara

(10) Patent No.: US 7,900,692 B2
(45) Date of Patent: Mar. 8, 2011

(54) COMPONENT PACKAGE HAVING HEAT EXCHANGER

(75) Inventor: Hideyuki Miyahara, Nagano (JP)

(73) Assignee: Nakamura Seisakusho Kabushikigaisha, Okaya-shi, Nagano-ken (JP)

( * ) Notice: Subject to any disclaimer, the term of this patent is extended or adjusted under 35 U.S.C. 154(b) by 1037 days.

(21) Appl. No.: 11/712,673

(22) Filed: Mar. 1, 2007

(65) Prior Publication Data
US 2007/0163749 A1   Jul. 19, 2007

(51) Int. Cl.
*H05K 7/20* (2006.01)
(52) U.S. Cl. .............. 165/104.26; 165/104.33; 165/80.4; 361/699; 361/700
(58) Field of Classification Search ............ 165/104.26, 165/104.33; 361/700
See application file for complete search history.

(56) References Cited

U.S. PATENT DOCUMENTS

| | | | | |
|---|---|---|---|---|
| 3,734,173 | A * | 5/1973 | Moritz | 165/104.26 |
| 4,046,190 | A * | 9/1977 | Marcus et al. | 165/104.26 |
| 5,990,552 | A * | 11/1999 | Xie et al. | 257/718 |
| 6,216,343 | B1 * | 4/2001 | Leland et al. | 29/890.032 |
| 6,293,333 | B1 * | 9/2001 | Ponnappan et al. | 165/104.26 |
| 6,725,910 | B2 * | 4/2004 | Ishida et al. | 165/104.26 |
| 6,752,204 | B2 * | 6/2004 | Dishongh et al. | 165/185 |
| 2001/0030039 | A1 * | 10/2001 | Copeland et al. | 165/104.26 |
| 2002/0189790 | A1 * | 12/2002 | Wong | 165/80.3 |
| 2003/0043544 | A1 * | 3/2003 | Nelson et al. | 361/690 |
| 2005/0056403 | A1 * | 3/2005 | Norlin et al. | 165/104.33 |
| 2005/0199372 | A1 * | 9/2005 | Frazer et al. | 165/80.4 |
| 2006/0213648 | A1 * | 9/2006 | Chen et al. | 165/104.33 |

FOREIGN PATENT DOCUMENTS

JP     2001-127201     5/2001

* cited by examiner

*Primary Examiner* — Allen J Flanigan
(74) *Attorney, Agent, or Firm* — Flynn, Thiel, Boutell & Tanis, P.C.

(57) ABSTRACT

In an electrical component package provided with a liquid-cooled heat exchanger, a main-body plate of the package and a crowning member that are composed of metal plates are joined together, forming a hollow part therebetween for use as a liquid-cooled heat exchanger in which a working fluid is sealed. A concavity for use in mounting an electrical component to be cooled is formed on the outer surface portion of the main-body plate of the package disposed opposite to the hollow part. An inner surface portion that faces into the hollow part of the main-body plate of the package is carved out using a carving tool, whereby fins are formed at a fine pitch on the inner surface portion. Minute channels for moving the working fluid are formed between the fins. Therefore, a flat electrical component package can be provided with a liquid-cooled heat exchanger that has excellent heat-radiating functionality.

7 Claims, 28 Drawing Sheets

(Prior Art)

COMPONENT PACKAGE HAVING HEAT EXCHANGER

BACKGROUND OF THE INVENTION

1. Field of the Invention

The present invention relates to a component package that is formed integrally with a heat exchanger. The present invention more particularly relates to a component package that has a heat exchanger and that is appropriate for use as an electrical component package wherein a liquid-cooled heat exchanger is formed integrally with a cavity-shaped package that forms a concavity in a metal plate for storing the electrical component; i.e., a stiffener or heat spreader.

2. Description of the Related Art

The rate at which computer equipment has been decreasing in size and increasing in performance has accelerated at a greater pace over the past several years. However, the amount of heat generated from semiconductor elements and integrated circuits has also increased along with performance, and efficient methods for cooling this heat are sought for further advances in miniaturization and performance. In order to cool highly integrated, high-output chips and the like, it is common for heat radiators to be attached to the package and forced-air cooling to be performed using cooling fans as necessary.

An electrical component package configured having integrally formed heat-radiating fins is proposed in JP-A 2001-127201. The package disclosed in this document will be described with reference to FIGS. 28A and 28B.

A package 200 is composed of metal and shaped into a cavity that forms a square concavity 202 on a surface 200a. A heat radiator 201, which is composed of a plurality of heat-radiating fins 201a, is formed integrally on the other surface 200b of the package 200. The heat-radiating fins 201a are integrally formed by thinning down the surface of the metal plate that forms the material of the package 200. The heat-radiating fins 201a are shaped as thin, square plates and rise from the surface 200b at a prescribed angle and with lateral symmetry.

A wiring substrate 203, which is composed of a TAB tape, a flexible printed substrate, or a normal printed substrate, is affixed to the surface 200a of the package 200. Printed wiring (not shown) is positioned on the wiring substrate 203 between numerous terminal parts 204 and external terminals provided to the outer edge.

The chips of a semiconductor integrated circuit 205 are housed in the concavity 202. Numerous terminals 206 that are provided to the semiconductor integrated circuit 205 are electrically connected by bonding wires 207 and the terminal parts 204 of the wiring substrate 203. A sealant 208 is injected into the concavity 202 of the package 200, sealing the semiconductor integrated circuit 205 and the bonding wires 207. Solder balls 209 are positioned at the external terminals provided to the outer edge of the wiring substrate 203. The solder balls 209 are melted under heating on prescribed locations on the circuit substrate of an electrical device (not shown), whereby the wiring substrate 203 and the circuit substrate of the electrical device are electrically connected.

The heat radiator 201 is formed integrally on the surface 200b of the package 200, whereby heat from the package 200 can be conveyed directly to the heat radiator 201. The loss of transmitted heat can therefore be reduced and heat radiation efficiency can be improved.

However, the following problems must be resolved in the package 200 of this configuration. First, the heat-radiating surface area of the heat-radiating fins 201a must be large in order to allow radiation of the heat generated from the semiconductor integrated circuit 205 housed in the concavity 202 of the package 200, and the heat-radiating fins 201a must therefore be tall. As a result, the package 200 increases in thickness and may not be able to be mounted on the electrical equipment of small-sized computers and the like.

Additionally, on a small package 200, the height to which the heat-radiating fins 201a can be formed is limited, so that an adequate heating-radiating surface area will be unobtainable. The semiconductor integrated circuit 205 may therefore not be adequately cooled.

Further, since the heat-radiating fins 201a are formed on the package 200, the stability of the package 200 is difficult to maintain when the semiconductor integrated circuit 205 is accommodated in the concavity 202 or when the wiring substrate 203 is affixed. Commonly used automated production lines therefore cannot be employed, and a specialized production line must be provided. Large investments in equipment are therefore necessary.

SUMMARY OF THE INVENTION

It is an object of the present invention to provide a small-sized, flat component package that has a heat exchanger and is provided with excellent heat-radiating functionality.

In order to solve the above-mentioned problems, a component package having a heat exchanger according to the present invention comprises:

a heat-exchanging hollow part that is formed between a first plate member and a second plate member;

plate-shaped fins that are formed integrally at prescribed intervals on an internal surface portion of at least one of the first and second plate members by carving out of the internal surface portion, which faces into the hollow part, wherein spaces between the fins function as channels for circulating a heat-exchanging working fluid; and a component-mounting part for mounting a component to be subjected to heat exchange, wherein the component-mounting part is formed on an outer surface portion that is disposed opposite to the inner surface portion of at least one of the first and second plate members.

According to the present invention, a heat exchanger is formed integrally on the component package for performing heat exchange using a working fluid (a cooling medium or a heating medium). One side of a plate member is made into a hollow part for circulating the working fluid, and the other side is made into a component-mounting part. Heat exchange can therefore be efficiently performed between the component and the working fluid via the plate member. A component package having excellent heat-exchange functionality can therefore be obtained.

The surface of the plate member is also carved out, whereby extremely thin plated-shaped fins are formed at extremely narrow intervals within the hollow part. Fine channels, through which the working fluid can move by capillary action, can therefore be formed between the fins. The attachment position of the component package is accordingly not affected, and the working fluid can be moved rapidly through the hollow part.

The first and second plate members are generally metal plates of aluminum, aluminum alloy, copper, copper alloy, or another metal with high thermal conductivity.

The fins may be formed on the inner surface portion of the first plate member in this instance, and the component-mounting part may be formed on the outer surface portion of the first plate member.

In order to form the hollow part in a sealed state for cycling or circulating the working fluid, a frame-shaped first flat-surface portion that surrounds the portion on which the fins are formed may also be formed on the first plate member; a concavity for forming the hollow part and a frame-shaped second flat-surface portion for encircling an outer circumference of the concavity may be formed on the second plate member; and the first and second flat-surface parts may be joined together.

The component-mounting part may be also made as a component-mounting concavity that is formed on the outer surface portion of the first plate member.

The component-mounting concavity can be formed by pressing the first plate member in an out-of-plane direction. The fins in such instances can be formed by carving out a convexity that is formed using the press and that protrudes from the inner surface portion of the first plate member.

Once the convexity has been cut off to make a flat surface, the fins may be formed by carving out the flat surface. In such instances, distal portions of the fins may be cut to the same height as the frame-shaped first flat-surface portion that surrounds the fins. The first plate member upon which the fins and the component-mounting concavity are formed can thereby be made thinner, which has the advantage of flattening the component package.

Cross sections of bottom parts of the channels are preferably made into an open rectangular shape in which at least one corner is an acute angle, and a width of the bottom parts of the channels is preferably 0.01 to 1.0 mm. The acute angle formed at the bottom improves capillary action in the channels formed between the fins, allowing movement and phase transformations of the working fluid to be carried out efficiently. Making the width of the channels 0.01 to 1.0 mm improves capillary action and further increases the efficiency of heat-exchange.

The component package of the present invention also comprises a concavity for mounting a plate member used for mounting the first plate member being formed in the second plate member, wherein the hollow part is formed on one side of the first plate member that is mounted in the concavity for mounting a plate member; the component-mounting part is formed on the other side of the first plate member; and the component-mounting part is a component-mounting concavity in which a bottom surface is regulated by the outer surface portion of the first plate member.

Since a concavity for mounting a plate member is formed in order to mount the first plate member on the second plate member, alignment can be easily performed when joining the two plate members together, simplifying the assembly work.

Distal ends of the fins in the component package of the present invention contact the inner surface portion of the plate member counter to the inner surface portion of the plate member on which the fins are formed; and numerous flow pathways for circulating the working fluid are sectioned off by the fins between the two opposing inner surface portions. Fine flow pathways are formed by the fins, allowing efficient heat exchange to be performed.

A configuration wherein the working fluid is sealed within the hollow part can be employed as the structure of the heat exchanger of the component package of the present invention. Heat exchange is carried out in the hollow part in such instances by repeatedly and alternatingly changing the phase of the working fluid and moving the working fluid along the channels.

Alternatively, a configuration may be employed wherein a flow inlet for introducing the working fluid into the hollow part and a flow outlet for discharging the working fluid from the hollow part may be formed, wherein the working fluid is cycled through the hollow part.

When fine flow pathways are partitioned by the fins within the hollow part, a flow-inlet communicating part, which communicatingly connects ends of the flow pathways on one side, and a flow-outlet communicating part, which communicatingly connects ends of the flow pathways on an other side, may be formed in within the hollow part, wherein a flow inlet for introducing the working fluid into the flow-inlet communicating part communicates with the flow-inlet communicating part; and a flow outlet for discharging the working fluid from the flow-outlet communicating part communicates with the flow-outlet communicating part.

DESCRIPTION OF THE PREFERRED EMBODIMENTS

Embodiments applying the present invention will be described below with reference to the drawings.

Embodiment A

Figure 1:
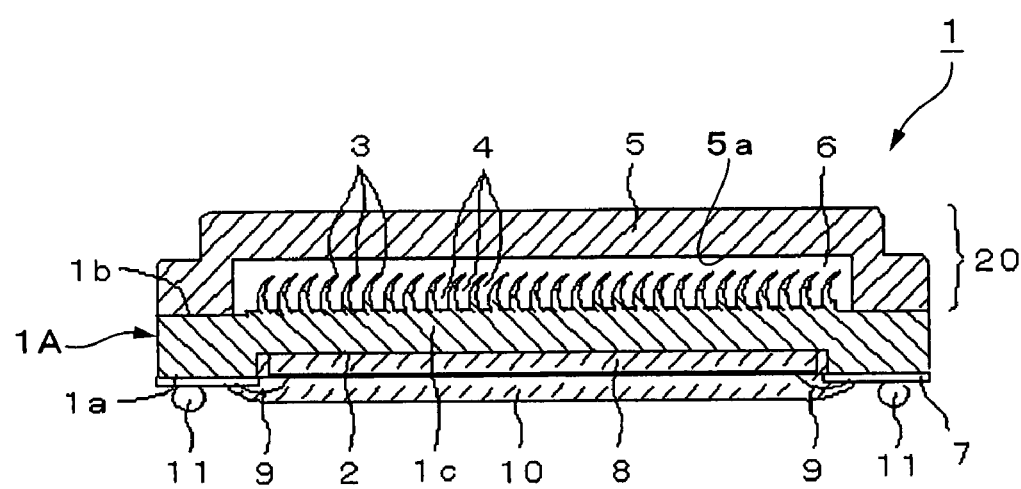
FIG. 1 is a cross-sectional view that shows an electrical component package provided with a liquid-cooled heat exchanger according to the present invention.
Figure 2:
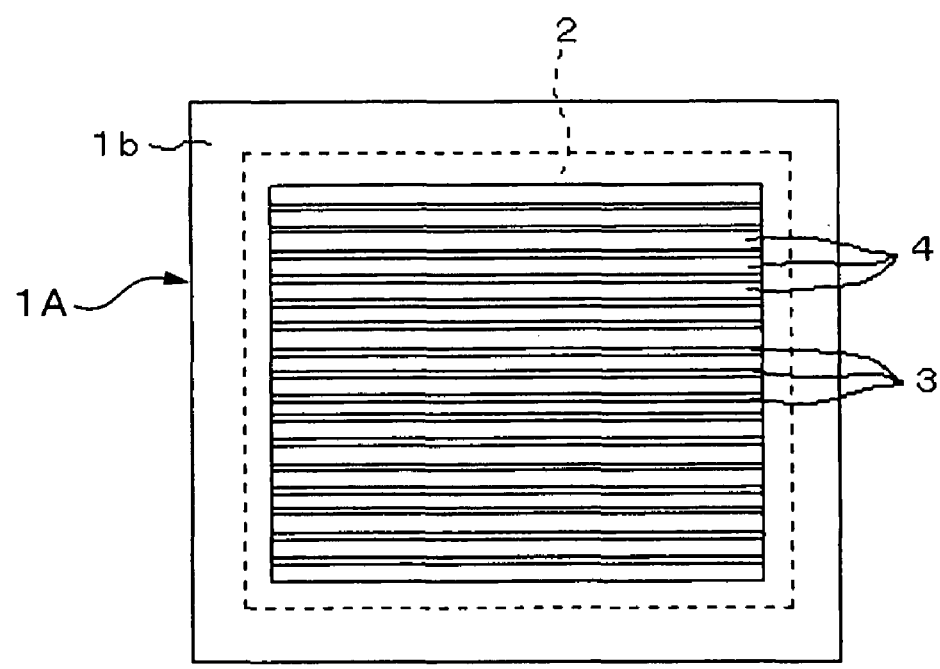
FIG. 2 is a plan view that shows the electrical component package of FIG. 1.
Figure 3:
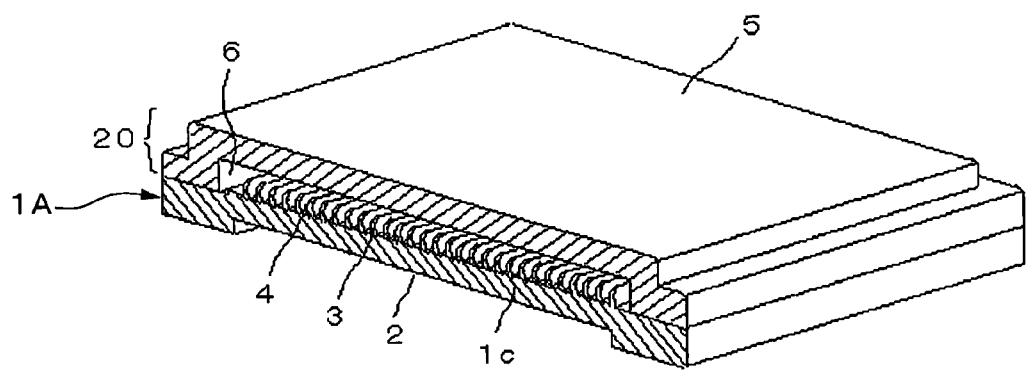
FIG. 3 is a partial cross-sectional perspective view that shows the electrical component package of FIG. 1.

FIG. 1 is a cross-sectional view that shows an electrical component package having a liquid-cooled heat exchanger according to embodiment A. FIG. 2 is a plan view that shows the liquid-cooled heat exchanger of embodiment A. FIG. 3 is a perspective view that shows a partial cross section of embodiment A.

A main-body plate 1A (first plate member) of an electrical component package 1 having a liquid-cooled heat exchanger (abbreviated below as "package 1") is formed from a metal plate. The metal plate has rigidity, good thermal conductivity, a thermal expansion coefficient that is compatible with the thermal expansion coefficients of the wiring substrate and the like described hereinafter, and is capable of being subjected to deformation processing. Stainless steel, aluminum, or a copper alloy can be used as the metal plate.

The main-body plate 1A of the package has a square concavity 2 (component-mounting concavity) formed on a surface 1a. The entirety of the main-body plate 1A of the package has the shape of a cavity wherein the bottom of the concavity 2 is regulated by a bottom plate portion 1c of a prescribed thickness. A liquid-cooled heat exchanger 20 is formed integrally on the other surface 1b of the main-body plate 1A of the package. Numerous plate-shaped fins 3 are formed at prescribed intervals on the surface 1b of the main-body plate 1A of the package. Minute channels 4 are formed between the fins 3.

A crowning member 5 (second plate member) is placed on top of the surface 1b on the inside of the main-body plate 1A of the package so as to cover the numerous channels 4. The edge of the opening of the crowning member 5 and the outer circumferential edge of the surface 1b of the package 1 are sealed together by welding, brazing, bonding, or other sealing means, forming a hollow part 6 that has a sealed structure. A working fluid is enclosed within the hollow part 6. Pure water, CFC alternatives, acetone, methanol, helium, nitrogen, ammonia, Dowtherm A, naphthalene, sodium, or the like may be used as the working fluid. The liquid-cooled heat exchanger 20 is thus composed of the main-body plate 1A of the package, the crowning member 5, the hollow part 6, the fins 3, the channels 4, and the working fluid.

A wiring substrate 7 that is composed of a TAB tape, printed substrate or the like is affixed to the outer surface 1a of the main-body plate 1A of the package, as shown in FIG. 1. Window holes are formed in the wiring substrate 7, and around these window holes are formed numerous terminal parts having a linewidth and pitch of approximately 37 μm. An IC chip 8 (heat-exchanging component) is housed in the concavity 2 and is fixed to the bottom plate portion 1c of the concavity 2 by a bonding agent so that the surfaces of the two are joined. Numerous terminals having the same linewidth and pitch as the terminal parts formed on the wiring substrate 7 are provided to the upper surface of the IC chip 8. The terminal parts of the wiring substrate 7 and the IC chip 8 are electrically connected by bonding wires 9. A sealant 10 is injected into the concavity 2, whereby the bonding wires 9 and the semiconductor integrated circuit mounted on the IC chip 8 are sealed.

Solder balls 11 are attached to the external terminals provided to the outer edge of the wiring substrate 7. When the package 1, which houses the IC chip 8, is installed on the circuit board of an electrical device (not shown), the solder balls may melt under heating with the package 1 temporarily fixed onto a prescribed location on the circuit substrate of the electrical device, and an electrical connection is established between the wiring substrate 7 and the circuit substrate of the electrical device.

Figure 4A:
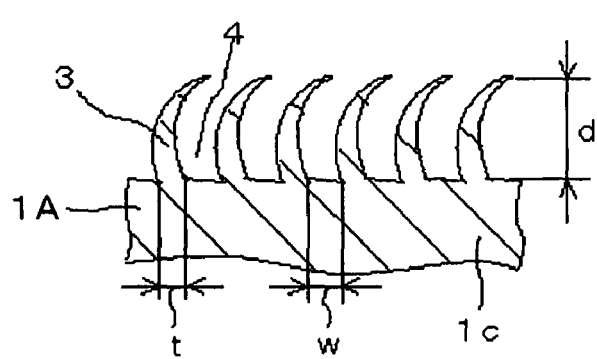
FIGS. 4A and 4B are enlarged cross-sectional views that show the channel parts of the electrical component package of FIG. 1.
Figure 4B:
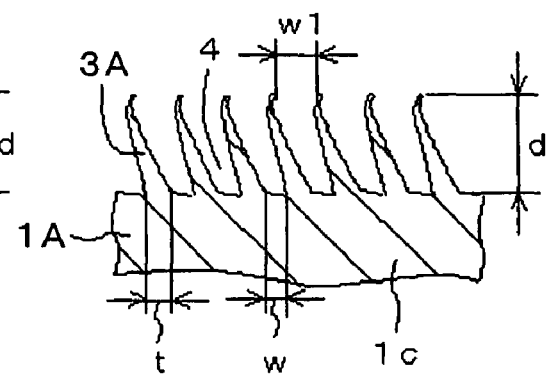

FIG. 4A is a partial enlarged cross-sectional view that shows the fins and channels that are formed on the main-body plate 1A of the package. FIG. 4B is a partial enlarged cross-sectional view that shows a modified example of the fins and channels. The cross-sections of the bottom parts of the channels 4, which are formed on the surface 1b of the main-body plate 1A of the package, are formed having a substantially rectangular shape, as shown in FIG. 4A. At least one of the corners of the bottom parts of the channels 4 is formed as an acute angle. The capillary action of the working fluid can be improved if the corner is acute. The thickness t of the fins 3 is 0.1 to 1 mm at the bottom part. The width w at the bottom of the channels 4 is 0.01 to 1.0 mm in order for the working fluid to generate adequate capillary action. The depth d of the channels 4 is 0.1 to 5.0 mm. The thickness of the bottom plate portion 1c is 0.1 to 2.0 mm.

The cross-sections of the channels 4 are all bent to one side due to the fact that the fins 3 are formed in a bent state when the main-body plate 1A of the package is carved out with the blade of a carving tool described hereinafter.

Fins 3A as shown in FIG. 4B are formed to be flatter than the fins 3 and can be used instead. The shapes of the fins 3 and the fins 3A change depending on the angle of carving and the shape of the blade of the carving tool, described hereinafter. The fins 3, which are formed by the blade of the carving tool, are formed having a thickness that gradually decreases from the proximal ends on the bottom plate portion 1c to the distal ends. The width w1 of the channels 4 grows slightly wider from the bottom part to the opening part.

The working fluid can move along the numerous channels 4 by capillary action. Specifically, the working fluid contained in the numerous channels 4 is heated by the heat generated by the IC chip 8 housed in the concavity 2, and vaporizes. The gaseous working fluid then flows within the hollow part 6 towards the ends of the channels 4 and is cooled, condensing once again and returning to a liquid state. The liquid-form working fluid moves by capillary action along the channels 4 towards the centers of the channels, and is then heated to a vapor once again by the heat generation of the IC chip 8. The IC chip 8 is cooled by repetitions of these phase transformations of evaporation and condensation.

Figure 5A:
FIGS. 5A and 5B are descriptive diagrams that show steps for forming the concavity and the convexity in the electrical component package of FIG. 1.
Figure 5B:
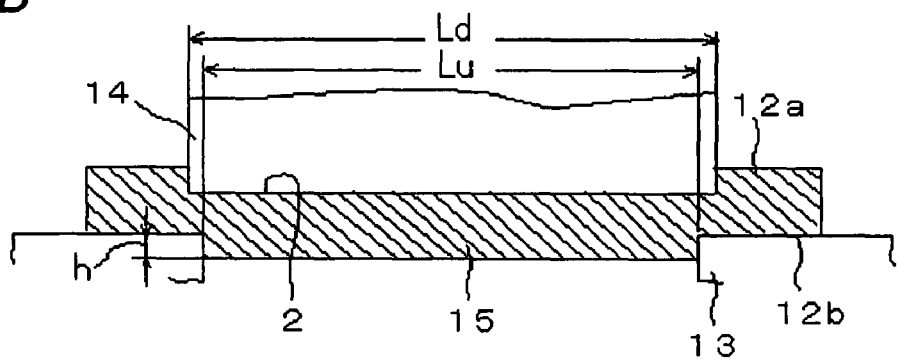
Figure 6:
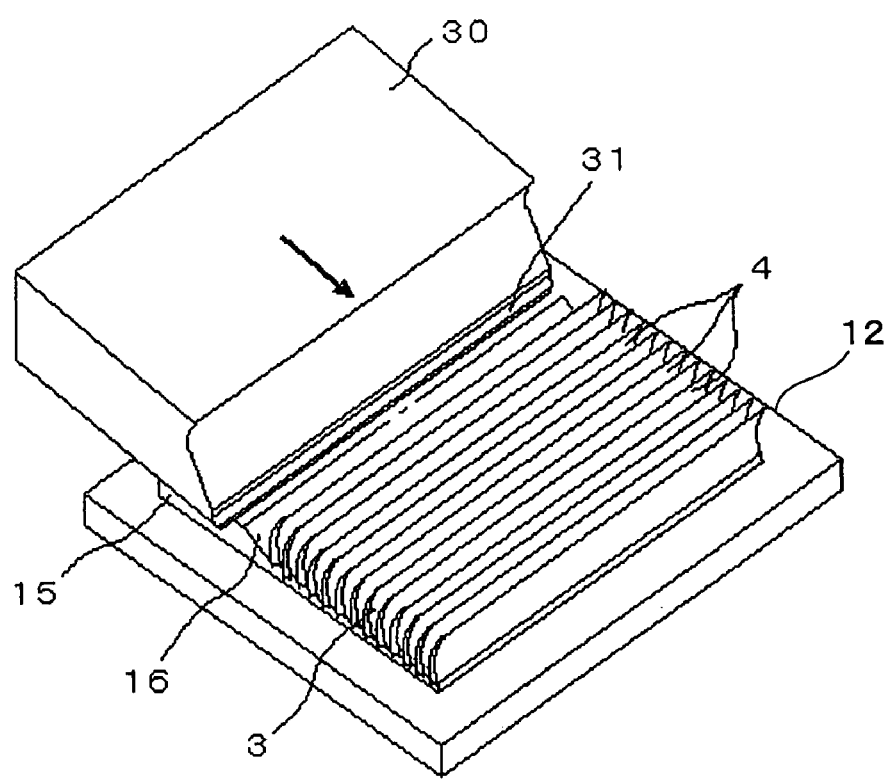
FIG. 6 is a perspective view that shows the process of forming the channel parts in the electrical component package of FIG. 1.

A method for manufacturing the package 1 will be described next with reference to FIGS. 5 through 7. FIGS. 5A and 5B are descriptive diagrams that show steps for forming a concavity and a convexity on the main-body plate 1A of the package. FIG. 6 and FIGS. 7A through 7E are descriptive diagrams that show steps for forming the channels 4 in the main-body plate 1A of the package.

As shown in FIG. 5A, a metal plate 12 that is used as the main-body plate 1A of the package is first formed into the shape of a flat shape having the width and thickness necessary for forming the main-body plate 1A of the package. As shown in FIG. 5B, the metal plate 12 is mounted and held in place on the die 13 of a press (not shown). A punch 14 that is attached to the press then applies pressure to the surface 12a of the metal plate 12, forming the concavity 2 in the metal plate 12 at a prescribed depth.

The press that forms the concavity 2 forms a convexity 15 that protrudes from the other surface 12b of the metal plate 12 at a height h that is substantially equal to the depth of the concavity 2. The shape of the cross section of the convexity 15 is analogous to the shape of the cross section of the concavity 2, and the external dimension Lu of the convexity 15 is slightly smaller than the dimension Ld at the opening of the concavity 2.

The numerous channels 4 of the liquid-cooled heat exchanger 20 are formed in the convexity 15 of the package 1 thus formed. A method for forming the channels 4 will be described with reference to FIG. 6 and FIGS. 7A through 7E.

Initially, a blade part 31 is formed on a carving tool 30 on the end of the bottom surface. The carving tool 30 is attached to a driving device (not shown) and tilted at a prescribed angle θ so that the rear end is higher relative to the convexity 15 of the main-body plate 1A of the package. The tilt angle θ of the carving tool 30 is established as appropriate according to the height and thickness of the fins 3, the material that composes the main-body plate 1A of the package, and other factors, but is generally roughly 5° to 20°.

Figure 7A:
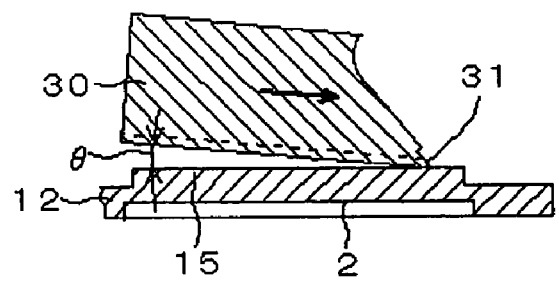
FIGS. 7A through 7E are descriptive diagrams that show steps for forming the channel parts of the electrical component package of FIG. 1.
Figure 7B:
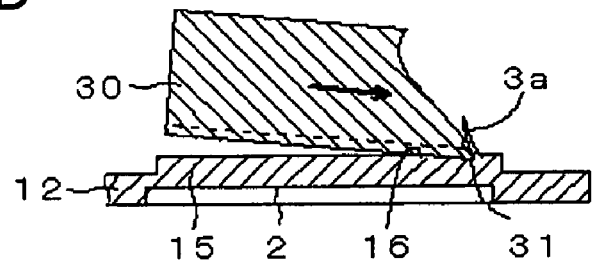
Figure 7C:
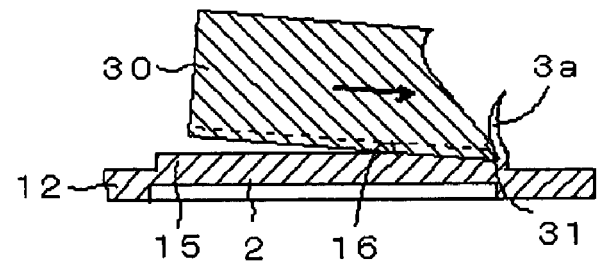

The metal plate 12 is mounted and held in place in a die (not shown). Once the carving tool 30 has been brought into contact with one end of the convexity 15, the carving tool 30, driven by the driving device (not shown), is moved towards the concavity 2 at a prescribed angle, as shown in FIG. 7A. The convexity 15 is thereby carved out by the blade part 31 on the end of the carving tool 30, as shown in FIG. 7B, and the end of a thin fin 3 rises up. When the carving tool 30 is moved to the next prescribed position, the convexity 15 is gradually carved out more deeply and a first fin 3a is formed at a prescribed height d, as shown in FIG. 7C. The depth carved out by the carving tool 30 preferably does not exceed the height of the convexity 15. A worked surface 16 is formed from the carving out the first fin 3a. Once the first fin 3a has been formed, the carving tool 30 is moved backwards and returned to standby position.

Figure 7D:
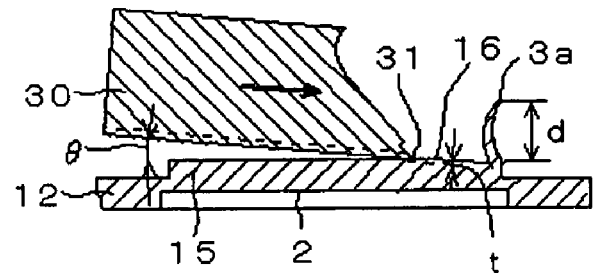

After the first fin 3a has been formed rising upwards, a second fin 3b is formed. The metal plate 12 is moved to the downstream side by a prescribed pitch towards the right side in FIG. 7C, and fixed in place on the die at this point. The blade part 31 of the carving tool 30 is then brought into contact at a location farther upstream than the worked surface 16, as shown in FIG. 7D. This contact location is established at the location on the worked surface 16 where a prescribed carving interval t is obtained. The carving interval t is established from approximately 0.01 to 0.5 mm.

Figure 7E:
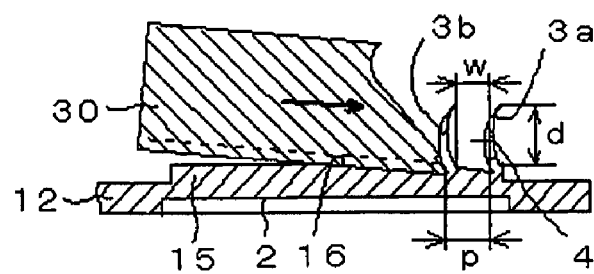

The carving tool 30 is moved towards the concavity 2 at the prescribed angle, carving out the metal plate 12 until the blade part 31 of the carving tool 30 reaches the position of a prescribed pitch p, as shown in FIG. 7E, whereby the thin second fin 3b is formed rising upwards. Another worked surface 16 is thereby formed. The carving tool 30 is then moved backwards once again and returned to standby position.

A channel 4 is formed between the previously formed first fin 3a and the subsequently formed second fin 3b. The cross-section at the bottom part of the channel 4 has a substantially rectangular shape. The corner of the channel 4 on the right side of FIG. 7E is formed as an acute angle. This angle is less than 90° and substantially equal to the angle of the blade part 31 of the carving tool 30.

The fins 3a, 3b are formed to have a thickness of 0.1 to 1 mm. The width w at the bottom of the channel 4 is established according to the position at which the carving tool 30 stops when forming the second fin 3b after having formed the first fin 3a. The width w of the channel 4 is established from 0.01 to 1.0 mm, which is necessary in order for adequate capillary action to be generated in the working fluid. The depth d of the channel 4 is established equal to the height of the fins 3, i.e., 0.1 to 1.0 mm.

In order to form the numerous fins 3 and channels 4 in the convexity 15 that is formed protruding from the metal plate 12, the carving tool 30 is moved to form the fins 3 at the prescribed pitch. In other words, once the metal plate 12 has been moved downstream and been fixed in place on the die, the steps for moving the carving tool 30 and forming a fin 3 rising upward from the convexity 15 are repeated. Numerous channels 4 are formed in the convexity 15 of the metal plate 12, whereby the area around the surface 1b of the main-body plate 1A of the package remains flat.

The crowning member 5 is formed from a metal plate that is composed of copper alloy, stainless steel, aluminum, or another material having good thermal conductivity that is capable of being subjected to deformation processing. Specifically, the metal plate is formed into a shape substantially in the form of a dish, as shown in FIG. 3, by a well-known pressing process. The frame-shaped flat surface portion around the crowning member 5 is then placed on the flat surface portion around the surface 1b of the main-body plate 1A of the package, and the numerous channels 4 are covered by the crowning member 5. The ends of the fins 3 and the inner surface portion 5a of the crowning member 5 are set apart at this point. The frame-shaped flat surface portion of the crowning member 5 and the flat surface portion of the main-body plate 1A of the package are sealed together by welding, brazing, bonding, or other sealing means, whereby the hollow part 6 is formed having a sealed structure between the main-body plate 1A of the package and the crowning member 5.

(Use of a Hoop-Shaped Metal Plate)

A hoop-shaped metal plate of aluminum, aluminum alloy, copper, copper alloy, or the like may be employed as the metal plate used for manufacturing the main-body plate 1A of the package or the crowning member 5.

Figure 8:
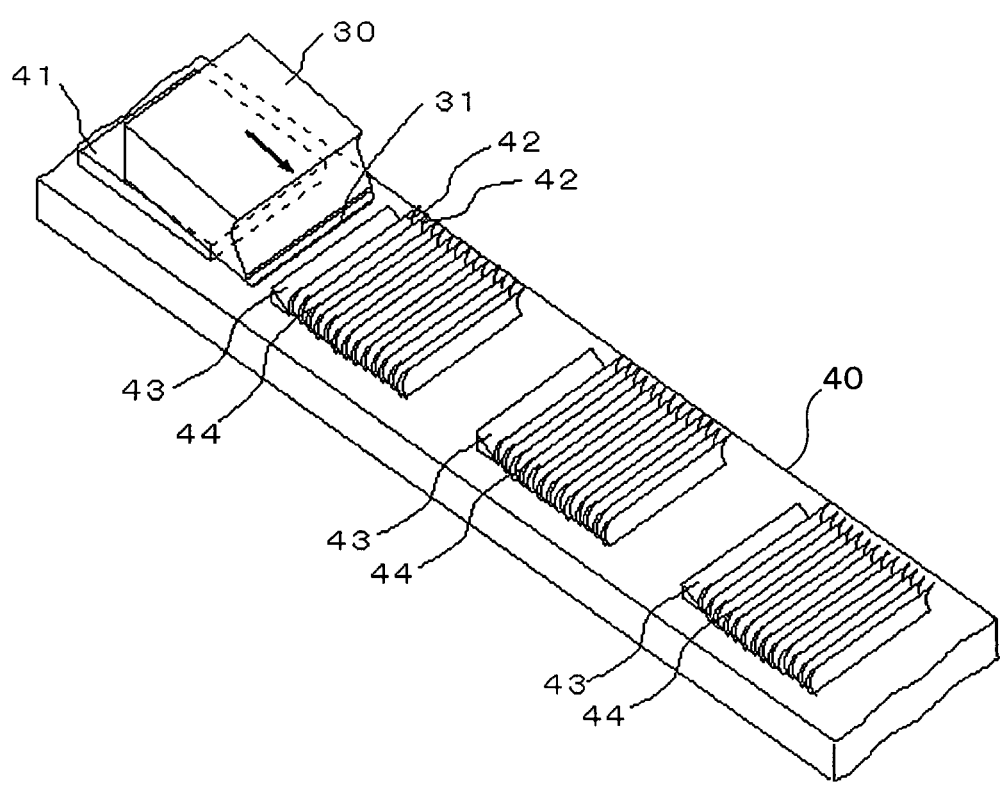
FIG. 8 is a perspective view that shows the channel-part forming process for forming the channel parts in a hoop-shaped metal plate.

FIG. 8 is a descriptive diagram that shows a process for manufacturing the main-body plate 1A of the package using a hoop-shaped metal plate. A hoop-shaped metal plate 40 is first mounted and held in place in a die (not shown). Next, a punch (not shown) that is affixed to a press is pressed down on one side of the metal plate 40 as in the step for forming a concavity that was described with reference to FIG. 5B, whereby a concavity is formed at a prescribed depth. A convexity 41 is thereby formed protruding from the opposite side of the metal plate 40 at a height that is substantially equal to the depth of the concavity. Convexities 41 are formed at constant intervals along the longitudinal direction of the hoop-shaped metal plate 40. Fins 42 are then formed as in the carving steps that were described with reference to FIGS. 7A through 7E.

Specifically, the convexities 41 are carved out by the blade part 31 of the carving tool 30, forming a thin fin 42 rising upwards. The hoop-shaped metal plate 40 is moved the distance of the prescribed pitch and then fixed in place in the die. The blade part 31 of the carving tool 30 is then brought into contact at a location where a prescribed carving interval is obtained that is farther upstream than a worked surface 43, after which the carving tool 30 is moved at the prescribed angle to carve out the convexity 41. As a result, a subsequently formed fin 42 is formed rising upwards at a location separated from the previously formed fin 42 by the prescribed pitch.

A channel 44 is formed between the previously formed fin 41 and the subsequently formed fin 41. The cross-section at the bottom part of the channel 44 has a substantially rectangular shape. One corner at the bottom of the channel 44 is formed as an acute angle. This angle is less than 90° and substantially equal to the angle of the blade part 31 of the carving tool 30.

The steps for forming the channel 44 are repeated until channels 44 are formed across the entire surface of the convexity 41. When the rear edge of the convexity 41 on the downstream side of the hoop-shaped metal plate 40 is reached, the carving interval of the worked surface 43 gradually shortens, and therefore the height of the fin 42 on the rear side of the convexity 41 decreases and the channel 44 becomes shallow. The intervals between the fins 42 are formed at a constant pitch, whereby the width of the channels 44 can be made constant. Once the numerous channels 44 have been formed and the hoop-shaped metal plate 40 has been moved to the position of the next convexity 41, the numerous fins 42 are once again formed rising upwards by the carving tool 30 and the numerous channels 44 are formed between the fins 42 as described above. Once the sequential convexities 41 have been formed protruding from the hoop-shaped metal plate 40, the steps for forming the channel parts are sequentially repeated to form the numerous channels 44 in the convexities 41.

Once the channels 44 have been formed in the convexities 41 that are formed at prescribed intervals, the hoop-shaped metal plate 40 is cut at prescribed cutting lines or cut into prescribed shapes as needed, whereby package main-body plates 1A can be obtained. The cutting step may involve cutting directly after the channels 44 have been formed in one of the convexities 41, or cutting after the channels 44 have been formed in a plurality of convexities 41. The fact that the channel parts 44 on the rear end of the convexities 41 grow gradually shallower does not present a problem during actual usage.

(Method for Sealing in the Working Fluid)

Figure 9:
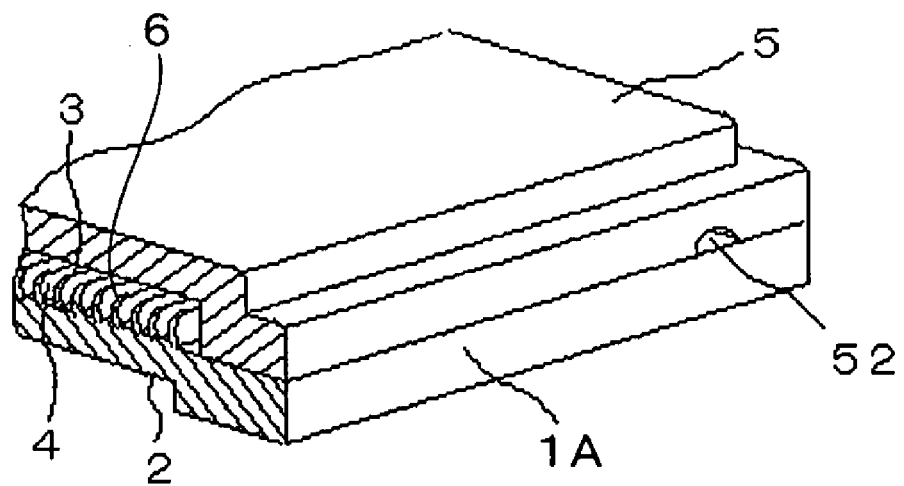
FIG. 9 is a partial cross-sectional perspective view that shows the electrical component package provided with a through-hole.
Figure 10A:
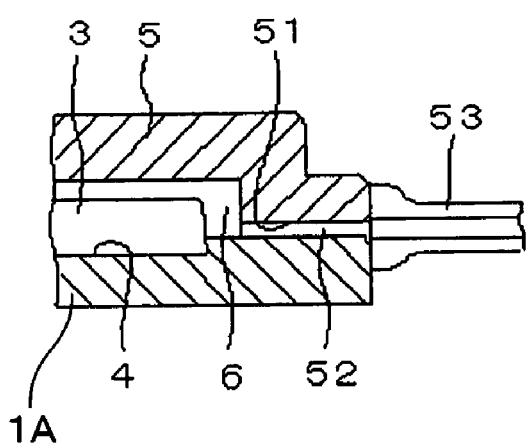
FIGS. 10A and 10B are descriptive diagrams that show a method for sealing the working fluid within the electrical component package shown in FIG. 9.
Figure 10B:
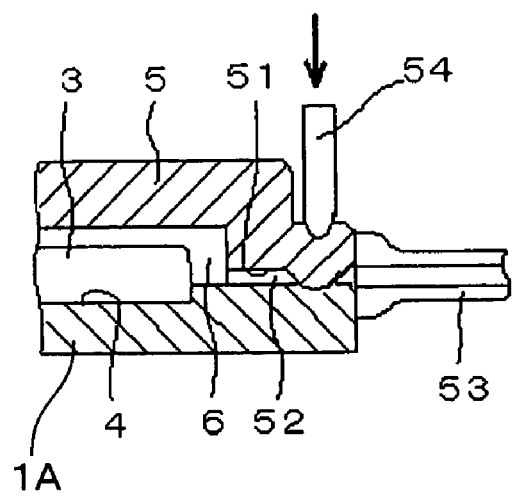

FIGS. 9, 10A, and 10B are descriptive diagrams that show an example of a method for sealing the working fluid in the liquid-cooled heat exchanger. The working fluid is accommodated in the hollow part 6 that is formed between the crowning member 5 and the main-body plate 1A of the package, and a prescribed vacuum is created within the interior of the hollow part 6. The process for filling the working fluid into the hollow part 6 must be carried out in a vacuum furnace that serves as the prescribed vacuum in order to create the prescribed vacuum within the hollow part 6. The working fluid may boil within the vacuum, making injection difficult. The process for sealing together the crowning member 5 and the main-body plate 1A of the package must also be carried out in a vacuum furnace in order to form a sealed structure within the hollow part 6, but the sealing process is quite difficult due to the vacuum.

When carrying out these processes in a vacuum furnace, the amount of working fluid may not be sufficient, or cooling of the heat-generating component may not be possible due to a lack of liquid-form working fluid that has evaporated. The temperature of the heat-generating component may increase excessively, resulting in decreased performance, damage, or other problems in the heat-generating component, which may be a semiconductor element, an integrated circuit, or the like. The vacuum within the hollow part 6 may diminish and the phase transformations and movement of the working fluid may decrease due to an incomplete seal between the crowning member 5 and the main-body plate 1A of the package, whereby problems will arise in that the cooling functionality of the liquid-cooled heat exchanger will markedly decrease.

The working fluid can be easily injected into the hollow part 6 according to the sealing method shown in FIGS. 9, 10A, and 10B, and the prescribed vacuum can also be easily created within the hollow part 6.

Specifically, a concave channel 51 is formed in the joined part (the frame-shaped flat surface portion) of the crowning member 5 joined to the package 1. The crowning member 5 and the main-body plate 1A of the package are joined together, forming a through-hole 52 as shown in FIG. 10A. The concave channel 51 can be formed at the same time by using a press on the crowning member 5. The concave channel 51 may also be formed in two locations near mutually opposing corner portions of the crowning member 5. Further, the concave channel 51 may also be formed on the outer edge portion of the main-body plate 1A of the package or on both the crowning member 5 and the main-body plate 1A of the package.

The end of an injection pipe 53, which is connected to means (not shown) for injecting the working fluid, is brought into contact with the through-hole 52, and a prescribed amount of working fluid is injected. The working fluid permeates the channels 4 due to capillary action in the channels 4, which function as wicks. The working fluid may also be injected into the through-hole 52 by, e.g., an injection-type needle.

The end of a degassing pipe 53, which is connected to degassing means (not shown), is then brought into contact with the through-hole 52, as shown in FIG. 10A, and the hollow part 6 is evacuated. Once the hollow part 6 has been degassed and the prescribed vacuum has been created, the through-hole 52 is closed shut by pressing down on top of the joined part of the crowning member 5 using a punch or other pressing tool 54 while the degassing pipe 53 is in contact with the through-hole 52 of the concave channel 51, as shown in FIG. 10B. As a result, a vacuum can be created after the working fluid has been injected into the hollow part 6.

Modified Example 1 of Embodiment A

Figure 11A:
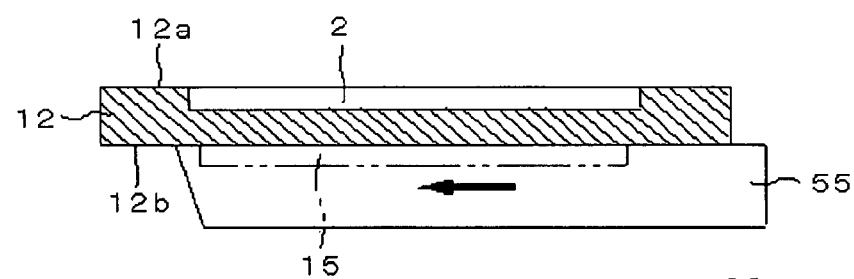
FIGS. 11A through 11C are descriptive diagrams that show alternate steps for forming the electrical component package.
Figure 11B:
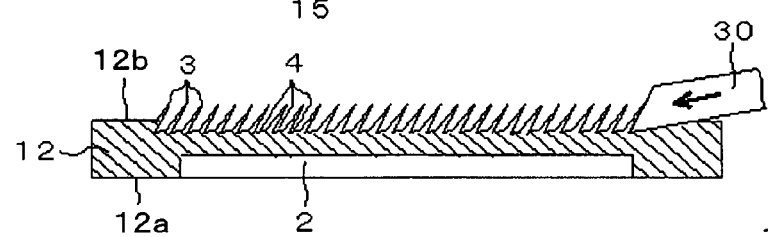
Figure 11C:
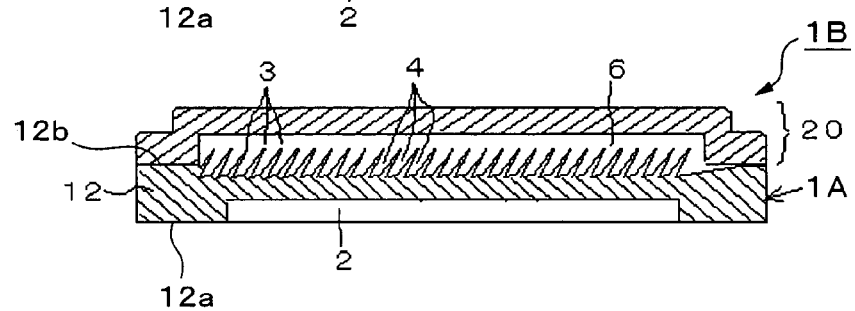

FIGS. 11A through 11C are descriptive diagrams that show a modified example of embodiment A. A package 1B of the present example is even thinner than the aforedescribed package 1. As shown in FIG. 11A, the concavity 2, which has a prescribed depth, is formed by pressing a punch that is affixed to a press (not shown) onto the surface 12a on one side of the flat metal plate 12 to form the main-body plate 1A of the package. The convexity 15 that protrudes from the opposite surface 12b of the metal plate 12 at a height that is substantially equal to the depth of the concavity 2 is formed due to the formation of the concavity 2. The convexity 15 is then divided once or a plurality of times by, e.g., a cutter 55 and removed, becoming the same height as the rest of the surface around the convexity-forming portion. Next, as shown in FIG. 11B, the fins 3 are formed by carving out the flattened surface 12b using the carving tool 30, and the numerous channels 4 of the liquid-cooled heat exchanger 20 are formed between the fins 3.

The method for forming the channels 4 is similar to the steps that were described earlier with reference to FIGS. 7A through 7E, and therefore a detailed description will be omitted and only the points of difference will be described. Specifically, after the carving tool 30 is brought into contact at the prescribed location on the surface 12b of the metal plate 12 in FIG. 11B, the carving tool 30 is moved towards the concavity 2 at the prescribed angle and the metal plate 12 is carved down, whereby the thin fin 3 is raised up as in the previously described method of formation. The carving tool 30 is then retracted to the upstream side, and the worked surface exposed by the formation of the fin 3 is carved down at the prescribed carving interval, whereby the next fin 3 is raised at the prescribed pitch. This operation is repeated, whereby the numerous channels 4 are formed in the surface 12b of the metal plate 12, thereby forming the main-body plate 1A of the package.

The channels 4 in this case are formed in a region within a prescribed distance from the outer circumferential edge so that the frame-shaped flat surface portion will remain along the outer circumferential edge portion of the main-body plate 1A of the package. The width of the carving tool 30 is therefore set smaller than the width of the main-body plate 1A of the package, and the flat surface portion remains on both sides of the carving tool 30. As shown in FIG. 11B, the location of the channel 4 that is formed first is set back a prescribed distance from the forward edge of the main-body plate 1A of the package, and the location of the channel 4 that is formed last is also set forward a prescribed distance from the back edge of the main-body plate 1A of the package.

The crowning member 5, which is formed into a shape substantially resembling a dish, is then set on top of the surface 12b of the main-body plate 1A of the package so as to cover the numerous channels 4, as shown in FIG. 11C. The fins 3 and the inner surface of the crowning member 5 are set apart at this point. The space between the crowning member 5 and the main-body plate 1A of the package is sealed by welding, brazing, bonding or other sealing means, forming the hollow part 6 in a sealed structure between the crowning member 5 and the main-body plate 1A of the package.

The convexity 15 that is formed protruding from the surface 12b of the main-body plate 1A of the package is thus removed and flattened. The numerous channels 4 are formed in the flattened surface, and a flat package can therefore be obtained.

Modified Example 2 of Embodiment A

Figure 12:
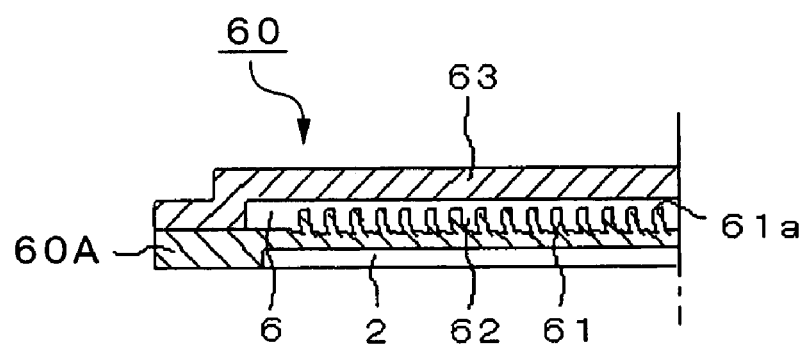
FIG. 12 is a cross-sectional view that shows an example provided with shallow channels.

FIGS. 12 and 13 are descriptive diagrams that show an example that is even thinner than the package 1. As shown in FIG. 12, a package 60 of the present example has channels that are shallower than in the previously described package 1B. Specifically, the tops of fins 61 are cut off, whereby flat surfaces 61a are formed, the cross sections of the channels 62 are made into a substantially square shape, and the depth of the channels 62 is reduced.

Figure 13A:
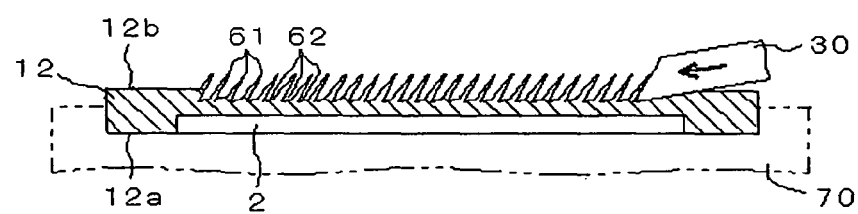
FIGS. 13A and 13B are step diagrams that show steps for forming the shallow channel parts in FIG. 12.

The method for forming the channels 62 is similar to the method of formation that was described with reference to FIGS. 11A and 11B. First, once the metal plate 12 has been mounted and secured in place in a die 70, the steps for carving the surface on one side of the metal plate 12 are carried out repeatedly using the carving tool 30, whereby the numerous fins 61 are formed having a prescribed height and the channels 62 are formed between the fins 61, as shown in FIG. 13A.

Figure 13B:
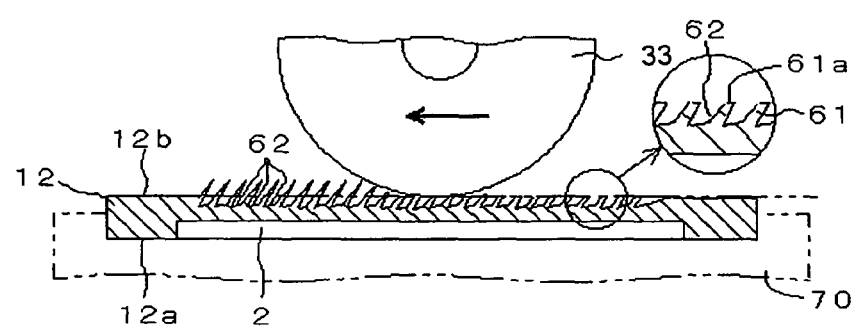

The tops of the fins 61 formed on the surface on one side of the metal plate 12 are then cut off by, e.g., a grinder 33 or another cutting tool, forming the flat surfaces 61a on the ends of the fins 61, as shown in FIG. 13B. The height of the fins 61 is established so that the tops are at substantially the same level as the flat surface portion that remains around the outer circumference of the package 60. The depth of the channels 62 can be established as desired by appropriately establishing the cut-off point of the fins 61. The depths of a portion of the channels 62 may also be changed as necessary.

The tops of the fins 61 are thus cut off by the cutting tool 33 and the ends are flattened, whereby the channels 62 can be set to the desired optimal depth. The height of the fins 61 is reduced, whereby the package 60 can be made thinner. When the tops of the fins 61 are established to be substantially the same as the flat surface portion that remains around the outer circumference of the package 60, the crowning part 63 that covers the numerous channels 62 can also be formed into a shallow dish shape, allowing the entire package to be made thinner.

Modified Example 3 of Embodiment A

Figure 14:
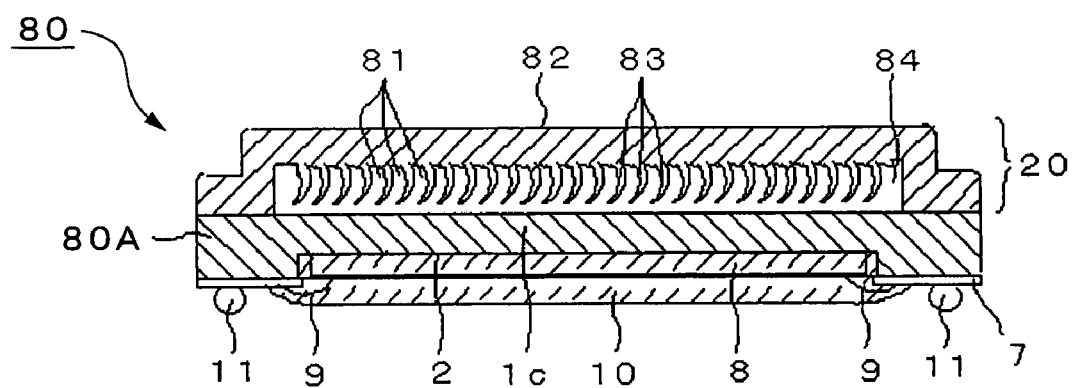
FIG. 14 is a cross-sectional view that shows an example wherein the channel parts are formed on the crowning member.

FIG. 14 is a cross-sectional view that shows an example in which the channels are formed on the inner surface portion of the crowning member. Once the concavity 2 has been formed on the main-body plate 80A of a package 80 of the present example, the convexity that is formed on the opposite surface is removed to form a flat surface, as in FIG. 11A.

Meanwhile, a crowning member 82, like the main-body plate 80A of the package, is composed of a metal plate of copper alloy, stainless steel, aluminum or another metal that has good thermal conductivity and is capable of being subjected to deformation processing. The crowning member 82 is also formed into a shape substantially in the form of a dish like the crowning member described previously. Numerous plate-shaped fins 83 are formed on the inner surface of the crowning member 82 at prescribed intervals, and a plurality of channels 81 that have prescribed widths and that induce capillary action are formed between the fins 83. The fins 83 and the channels 81 are formed as in the previously described method for forming the fins and channels on the other surface of the package, and therefore a description of that method will be omitted. The crowning member 82 is formed into a shape substantially in the form of a dish after the fins 83 and the channels 81 have been formed on the flat metal plate.

The crowning member 82 is placed upon the other surface of the main-body plate 80A of the package, and the edge of the opening of the crowning member 82 and the outer circumferential edge on the other surface of the main-body plate 80A of the package are sealed together by welding, brazing, bonding or other sealing means. A hollow part 84 is thereby formed that has a sealed structure. A working fluid of pure water, a CFC alternative, acetone, methanol, helium, nitrogen, ammonia, Dowtherm A, naphthalene, sodium, or the like is injected into the hollow part 84 to act as a liquid-cooled heat exchanger.

Figure 15:
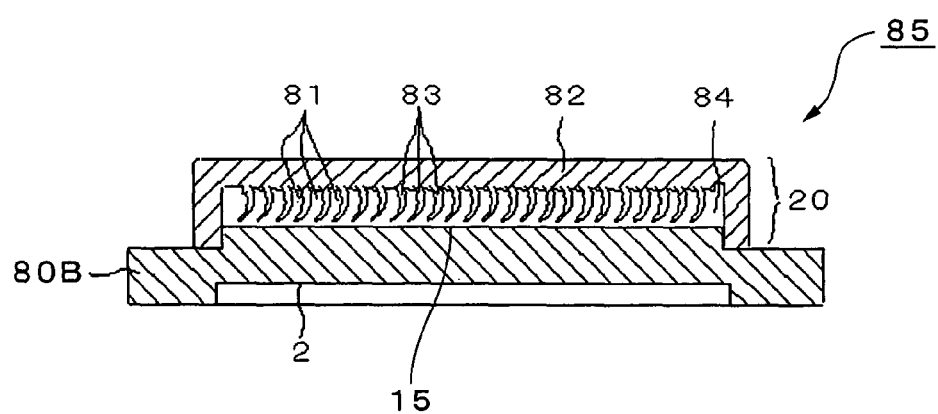
FIG. 15 is a cross-sectional view that shows an alternate example wherein the channel parts are formed on the crowning member.

In a package 85 shown in FIG. 15, the convexity 15, which is formed on the opposite surface when the component-mounting concavity 2 is formed, remains in place. The dimensions within the opening part of the crowning member 82 are established so that the convexity 15 of a main-body plate 80B of the package can be lightly or otherwise press-fit into the opening part. The hollow part 84 is formed having a sealed structure when the crowning member 82 is set on the main-body plate 80B of the package. A working fluid that functions as a liquid-cooled heat exchanger is injected into the hollow part 84.

Modified Example 4 of Embodiment A

Figure 16A:
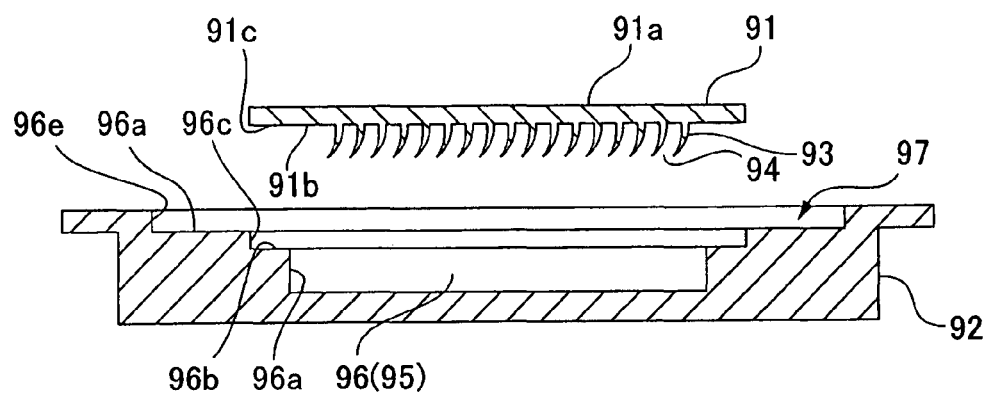
FIGS. 16A and 16B are a disassembled cross-sectional view and a cross-sectional view that show the primary components of an example configured so that the first plate member, which is provided with the fins, is fit into the second plate member.
Figure 16B:
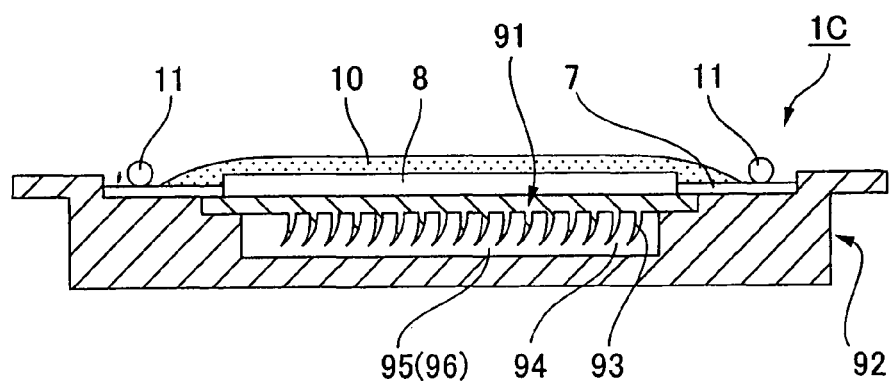

FIG. 16A is a disassembled view that shows the main components of a modified example of the package 1, and FIG. 16B is a cross-sectional view. A package 1C of the present example is provided with a first plate member 91 and a second plate member 92, which are both metal plates. The first plate member 91 is a flat member that has a flat surface 91a on one side and has numerous plate-shaped fins 93 formed at a fine pitch on a surface 91b on the other side. Minute channels 94 are formed between the fins 93. The width of the carving tool is narrower than the width of first plate member 91 that has the fins, as was described with reference to FIG. 11B, and flat surface portions of the first plate member 91 remain on both sides of the carving tool 30. The location of the channel 94 that is formed first is set back a prescribed distance from the forward edge of the first plate member 91, and the location of the channel 94 that is formed last is also set forward a prescribed distance from the back edge of the first plate member 91. As a result, a frame-shaped flat surface portion 91c that surrounds the region on which the fins 93 are formed remains on the outer circumferential portion of the surface 91b of the first plate member 91.

Meanwhile, a rectangular convexity 96 is formed in the second plate member 92 in order to form a hollow part 95 for heat exchange. The surface on the inner circumference of the convexity 96 is a stepped surface having two levels that recede to the outside facing the opening of the convexity 96. Specifically, a rectangular frame-shaped step surface 96b is formed so as to expand towards the outside continuous with the upper edge of the inner circumferential surface 96a of the convexity 96 for forming the hollow part 95. An inner circumferential surface 96c is formed rising at a right angle from the outer circumferential edge of the step surface 96b. A rectangular, frame-shaped step surface 96d is also formed so as to expand towards the outside continuous with the upper edge of the inner circumferential surface 96c, and an inner circumferential surface 96e is formed rising at a right angle from the outer circumferential edge of the step surface 96d.

The first plate member 91 is fit within the inner circumferential surface 96c, and the rectangular frame-shaped flat surface portion 91c of the first plate member 91 is joined together with the rectangular frame-shaped step surface 96b, forming the hollow part 95 in a sealed state. A working fluid is sealed within the hollow part 95.

The outer surface 91a of the first plate member 91 has substantially the same height as the step surface 96d of the second plate member 92 when the first plate member 91 is fit into the second plate member 92. A convexity 97 for mounting the IC chip 8 that acts as the object of heat exchange is formed by the surface 91a, the step surface 96d, and the inner circumferential surface 96e.

The IC chip 8 is mounted on the area facing the portion of the surface 91a of the first plate member 91 on which the fins 93 are formed. The wiring substrate 7 is positioned surrounding the IC chip 8, and is sealed together with the IC chip 8 by the sealant 10.

The convexity 96 for forming the hollow part 95, the convexity for mounting the first plate member 91, which is regulated by the step surface 96b and the inner circumferential surface 96c, and the convexity for mounting the IC chip, which is regulated by the step surface 96d and the inner circumferential surface 96e, are formed on the second plate member 92 of the package 1C of this configuration. The first plate member 91 and the second plate member 92 are held in position when the first plate member 91 is fit into the second plate member 92, and therefore the process of assembly can be easily carried out.

Embodiment B

Figure 17:
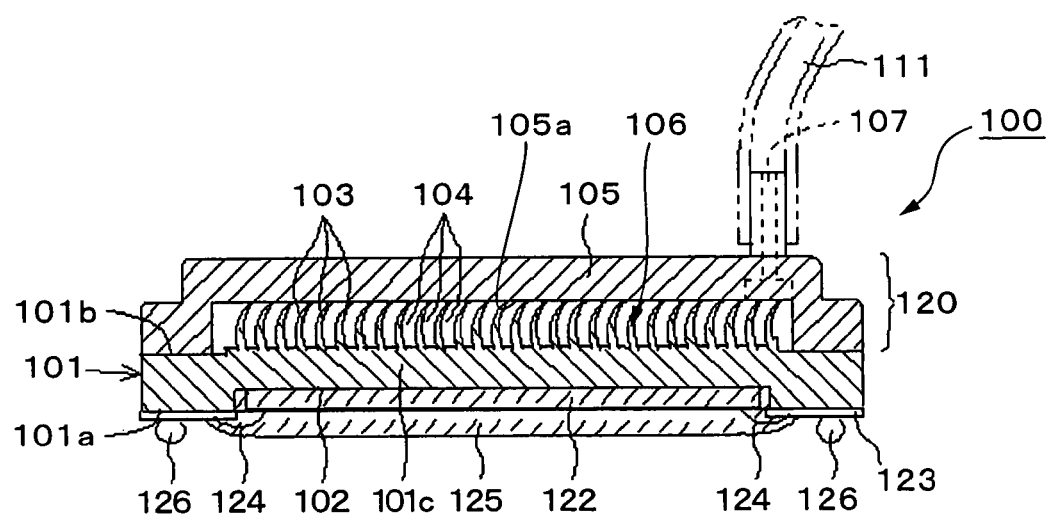
FIG. 17 is a cross-sectional view that shows an electrical component package according to the present invention.
Figure 18:
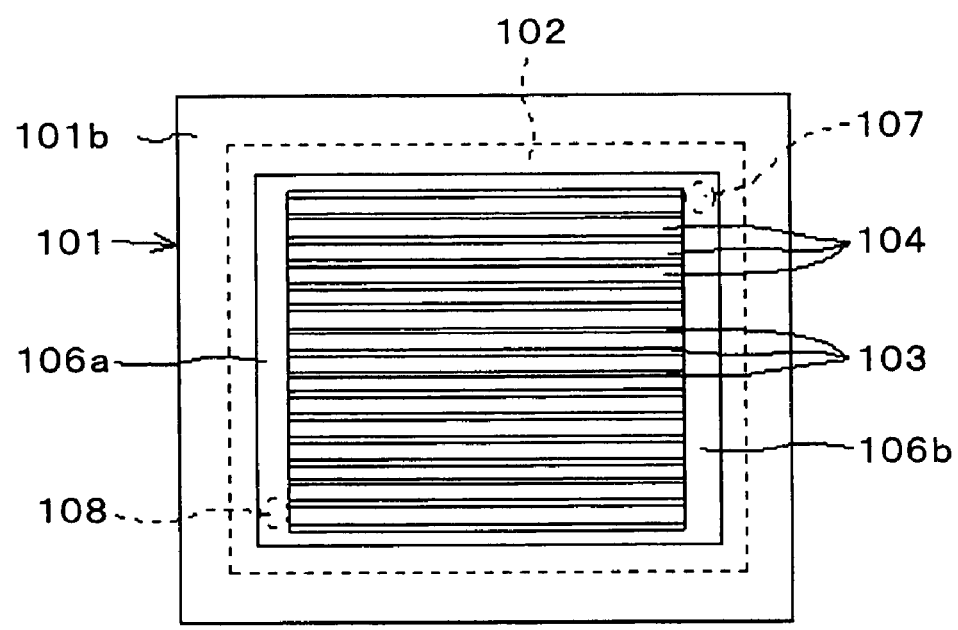
FIG. 18 is a plan view that shows the cooling part of the electrical component package of FIG. 17.
Figure 19:
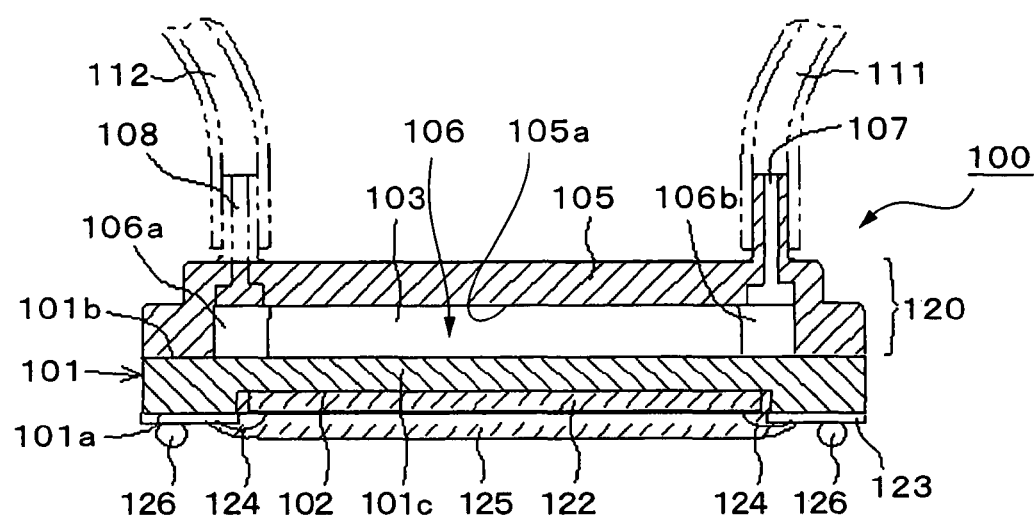
FIG. 19 is a cross-sectional view of the electrical component package of FIG. 17.
Figure 20:
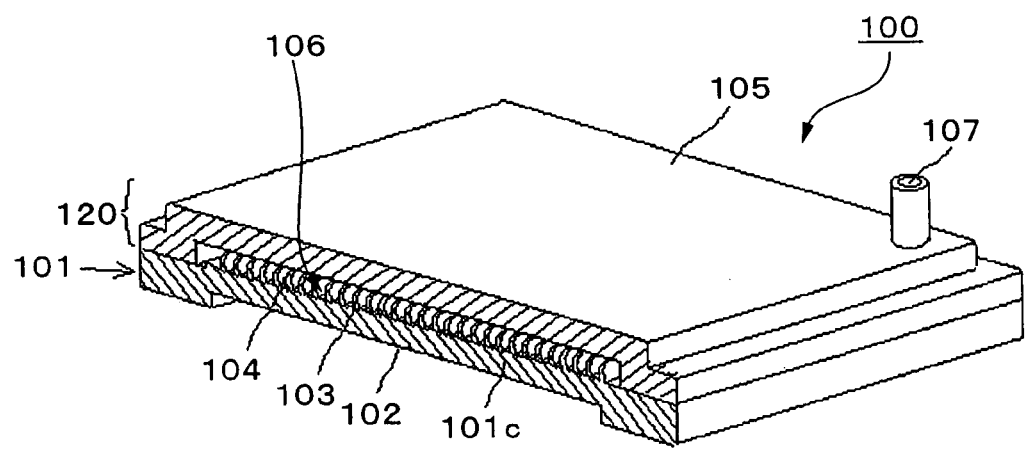
FIG. 20 is a perspective view that shows a partial cross section of the electrical component package of FIG. 17.

FIG. 17 is a cross-sectional view that shows an electrical component package having a cooling part (referred to below simply as "package") according to embodiment B of the present invention. FIG. 18 is a plan view that shows the cooling part of embodiment B. FIG. 19 is a cross-sectional view of a portion of the package that is cut in the direction perpendicular to the cross-section of FIG. 17. FIG. 20 is a perspective view that shows a partial cross-section of embodiment B.

A main-body plate 101 (first plate member) of a package 100 according to the present embodiment is formed from a metal plate. The metal plate has rigidity, good thermal conductivity, a thermal expansion coefficient that is compatible with the thermal expansion coefficients of the wiring substrate and the like described hereinafter, and is capable of being subjected to deformation processing. Stainless steel, aluminum, or a copper alloy can be used as the metal plate.

The main-body plate 101 of the package has a square concavity 102 (component-mounting concavity) formed on a surface 101a. The entirety of the main-body plate 101 of the package has the shape of a cavity wherein the bottom of the concavity 102 is regulated by a bottom plate portion 101c of a prescribed thickness. A cooling part 120 is formed integrally on the other surface 101b of the main-body plate 101 of the package. Numerous plated-shaped fins 103 are formed at prescribed intervals on the surface 101b of the main-body plate 101 of the package. Minute channels 104 are formed between the fins 103.

A crowning member 105 (second plate member) is placed on top of the surface 101b of the main-body plate 101 of the package so as to cover the numerous channels 104. The edge of the opening of the crowning member 105 and the outer circumferential edge of the surface 101b of the main-body plate 101 of the package are sealed by welding, brazing, bonding, or other sealing means, forming a hollow part 106 that has a sealed structure.

The longitudinal width of the fins 103 and the channels 104 is smaller than the width of the inner surface portion 105a of the crowning member 105, as shown in FIGS. 18 and 19. As a result, fluid-accumulating parts 106a, 106b are formed on both sides of the hollow part 106, i.e., on both sides of the channels 104. The ends of the numerous fins 103 contact the opposing inner surface portion 105a of the crowning member 105. As a result, flow pathways, which are composed of the channels 104 that have fine widths and are partitioned by the fins 103, are formed sectioned off within the hollow part 106 and are connected on one side by the fluid-accumulating part 106a and on the other side by the fluid-accumulating part 106b.

A flow inlet 107 and a flow outlet 108 are provided to locations on the crowning member 105 that correspond to the fluid-accumulating parts 106a, 106b. The flow inlet 107 and the flow outlet 108 are formed integrally with the outer surface of the crowning member 105 and protrude therefrom, forming hollow, cylindrical shapes so as to communicate with the respective fluid-accumulating parts 106a, 106b. An injection pipe 111, which is connected to means (not shown) for injecting coolant fluid, is connected to the flow inlet 107, and a fluid-removal pipe 112 is connected to the flow outlet 108.

A wiring substrate 123 that is composed of a TAB tape, printed substrate, or the like is affixed to the surface 101a of the main-body plate 101 of the package, as shown in FIGS. 17 and 19. Window holes are formed in the wiring substrate 123, and around these window holes are formed numerous terminal parts having a linewidth and pitch of approximately 37 μm. An IC chip 122 is housed in the concavity 102 and is fixed to the bottom plate portion 101c of the concavity 102 by a bonding agent so that the surfaces of the two are joined. Numerous terminals having the same linewidth and pitch as the terminal parts formed on the wiring substrate 123 are provided to the upper surface of the IC chip 122. The terminal parts of the wiring substrate 123 and the IC chip 122 and are electrically connected by bonding wires 124. A sealant 125 is injected into the concavity 102, whereby the bonding wires 124 and the IC chip 122 are sealed.

Solder balls 126 are attached to the external terminals provided to the outer edge of the wiring substrate 123. When the package 100, which houses the IC chip 122 and the like, is installed on the circuit board of an electrical device (not shown), the solder balls 124 may melt under heating with the package 100 temporarily fixed onto a prescribed location on the circuit substrate of the electrical device, an electrical connection is established between the wiring substrate 123 and the circuit substrate of the electrical device.

In the package 100 of this configuration, the coolant fluid that is introduced from the flow inlet 107 by the injection pipe 111 temporarily accumulates in the fluid-accumulating part 106b before circulating through the numerous channels 104. Heat generated from the IC chip 122 housed in the concavity 102 of the package 100 at that point is cooled by the coolant fluid circulating within the channels 104, minimizing temperatures increases in the IC chip 122. Coolant fluid that is heated by flowing through channels 104 accumulates temporarily in the fluid-accumulating part 106a near the flow outlet 108 before being discharged from the flow outlet 108 by means of the fluid-removal pipe 112. Water, CFC alternatives, acetone, methanol, helium, nitrogen, or another such liquid or gas can be used as the coolant fluid that is circulated in the channels 104.

Figures 21A, 21B:
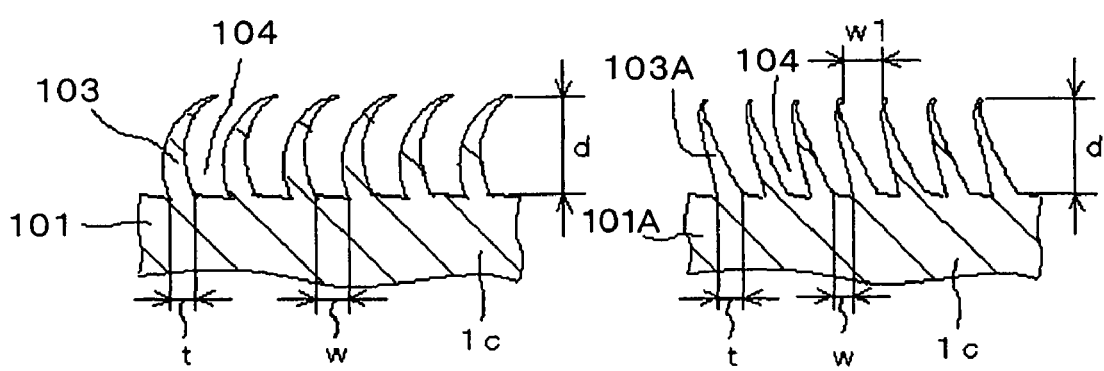
FIGS. 21A and 21B are enlarged cross-sectional views that show the channel parts of the electrical component package of FIG. 17.

FIG. 21A is a partial enlarged cross-sectional view that shows the fins and channels that are formed on the main-body plate 101 of the package. FIG. 21B is a partial enlarged cross-sectional view that shows a modified example of the fins and channels. The cross-sections of the bottom parts of the channels 104, which are formed on the surface 101b of the main-body plate 101 of the package, are formed having a substantially rectangular shape, as shown in FIG. 21A. At least one of the corners of the bottom parts of the channels 104 is formed as an acute angle. The capillary action of the working fluid can be improved if the corner is acute. The thickness t of the fins 103 is 0.1 to 1 mm at the bottom part. The width w at the bottom of the channels 104 is 0.01 to 5.0 mm in order for the working fluid to generate adequate capillary action. The depth d of the channels 104 is 0.1 to 7.0 mm, substantially equal to the height of the fins 103 and therefore to the width of the hollow part 106.

Specifically, when the crowning member 105 is put on the surface 101b of the main-body plate 101 of the package, the bent portions on the ends of the fins 103 are pressed down by the inner surface portion 105a of the crowning member 105. The height of the fins 103 is therefore restricted by the inner surface portion 105a of the crowning member 105. The depth d of the channels 104 is therefore substantially equal to the height up to the inner surface portion 105a of the crowning member 105. The end parts of the fins 103 are thus pressed against the inner surface portion 105a, whereby the channels 104 formed between the numerous fins 103 are all separated, allowing the coolant fluid to be circulated substantially uniformly within the channels 104. Even if there are variations in the heights of the fins 103, the bent portions bend when pressed down by the inner surface portion 105a and the variations are minimized, reliably separating the channels 104. Furthermore, the thickness of the bottom plate portion 101c is 0.1 to 2.0 mm.

Fins 103A as shown in FIG. 21B are formed to be flatter than the fins 103 and can be used instead of the fins 103. The shapes of the fins 103 and the fins 103A change depending on the angle of carving and the shape of the blade of the carving tool. The fins 103, which are formed by the blade of the carving tool, are formed having a thickness that gradually decreases from the proximal ends on the bottom plate portion 101c to the distal ends. The width w1 of the channels 104 grows slightly wider from the bottom part to the opening part.

The package 100 that is provided with the cooling part 120 and that is configured as described above can be manufactured as in the steps that were described with reference to FIGS. 5A, 5B, 6, and 7A through 7E.

A hoop-shaped metal plate of aluminum, aluminum alloy, copper, copper alloy, stainless steel, or the like may also be used for the metal plate used for the crowning member 105 and the main-body plate 101 of the package. Manufacturing steps in this instance can be implemented as in the steps that were described with reference to FIG. 9.

Modified Example 1 of Embodiment B

Figure 22A:
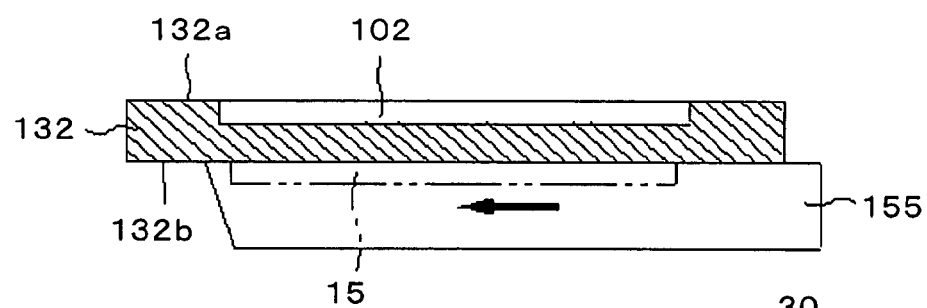
FIGS. 22A through 22C are descriptive diagrams that show steps for manufacturing an electrical component package whose structure is suited to being made flat.
Figure 22B:
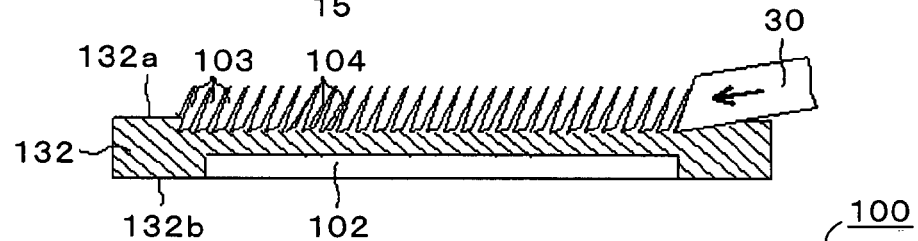
Figure 22C:
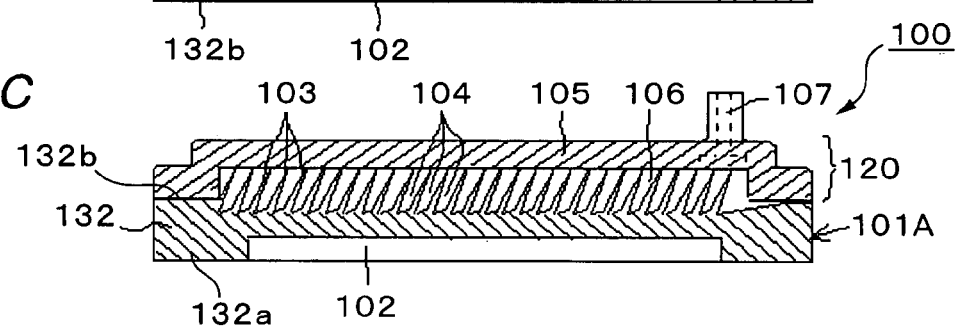

FIGS. 22A through 22C are descriptive diagrams that show an example that is even thinner than the package 100. As shown in FIG. 22A, the concavity 102, which has a prescribed depth, is formed by pressing a punch that is affixed to a press (not shown) onto the surface 112a on one side of the flat metal plate 132 to form the main-body plate 101 of the package. The convexity 115 that protrudes from the opposite surface 132b of the metal plate 132 at a height that is substantially equal to the depth of the concavity 102 is formed due to the formation of the concavity 102. The convexity 115 is then divided once or a plurality of times by, e.g., a cutter 155 and removed, becoming the same height as the rest of the surface around the convexity-forming portion. Next, as shown in FIG. 22B, the fins 103 are formed by carving out the flattened surface 132b using a carving tool 130, and the numerous channels 104 of the cooling part 120 are formed between the fins 103.

The method for forming the channels 104 is similar to the steps that were described earlier with reference to FIGS. 7A through 7E, and therefore a detailed description will be omitted and only the points of difference will be described. Specifically, after the carving tool 130 is brought into contact at the prescribed location on the surface 132b of the metal plate 132 in FIG. 22B, the carving tool 130 is moved towards the concavity 102 at the prescribed angle and the metal plate 112 is carved down, whereby the thin fin 103 is raised up as in the previously described method of formation. The carving tool 130 is then retracted to the upstream side, and the worked surface exposed by the formation of the fin 103 is carved down at the prescribed carving interval, whereby the next fin 103 is raised at the prescribed pitch. This operation is repeated, whereby the numerous channels 104 are formed in the surface 132b of the metal plate 132, thereby forming the main-body plate 101 of the package.

The channels 104 in this case are formed in a region within a prescribed distance from the outer circumferential edge so that the frame-shaped flat surface portion will remain along the outer circumferential edge portion of the main-body plate 101 of the package. The longitudinal width of the channels 104 is reduced to form the fluid-accumulating parts 106a, 106b on both sides of the channels 104. The width of the carving tool 130 is therefore set smaller than the width of the main-body plate 101 of the package, and the flat surface portion that is composed of the fluid-accumulating parts 106a, 106b remains on both sides of the carving tool 130. As shown in FIG. 22B, the location of the channel 104 that is formed first is set back a prescribed distance from the forward edge of the main-body plate 101 of the package, and the location of the channel 104 that is formed last is also set forward a prescribed distance from the back edge of the main-body plate 101 of the package.

The crowning member 105, which is formed into a shape substantially resembling a dish, is then set on top of the surface 132b of the main-body plate 101 of the package so as to cover the numerous channels 104, as shown in FIG. 22C. The ends of the fins 103 are in contact with the inner surface portion 105a of the crowning member 105 at this point. The crowning member 105 and the main-body plate 101 of the package are fixed together by welding, brazing, bonding or other fixing means. The numerous channels 104 are thus covered by the crowning member 105, wherefrom the cooling part 120 is constituted. The hollow, cylindrical flow inlet 107 and flow outlet 108 are formed integrally protruding from the crowning member 105 so as to communicate with the fluid-accumulating parts 106a, 106b, as in the example described previously.

The convexity 115 that is formed protruding from the surface 132b of the main-body plate 101 of the package is thus removed and flattened. The numerous channels 104 are formed in the flattened surface, and a thin package can therefore be obtained.

Modified Example 2 of Embodiment B

Figure 23:
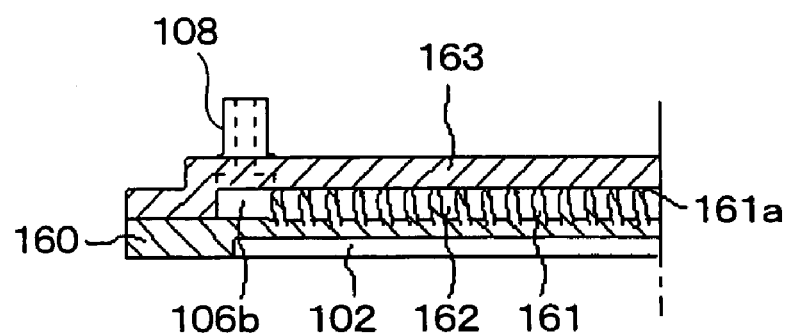
FIG. 23 is a half-sectional view that shows an example provided with shallow channels.
Figure 24A:
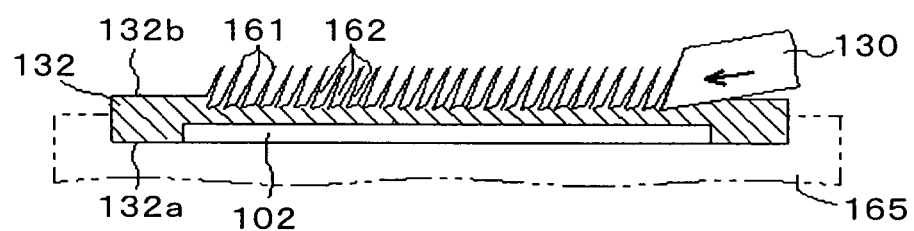
FIGS. 24A and 24B are descriptive diagrams that show steps for forming the shallow channels shown in FIG. 23.
Figure 24B:
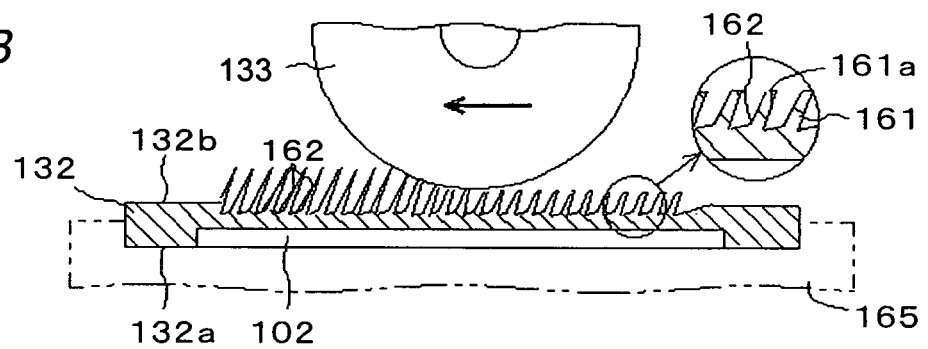

FIGS. 23, 24A, and 24B are descriptive diagrams that show an example that is even thinner than the aforedescribed package 100. As shown in FIG. 23, a package 160 of the present example has channels that are shallower than in the previously described package 100. Specifically, the tops of fins 161 are cut off, whereby flat surfaces 161a are formed, the cross sections of the channels 162 are made into a substantially square shape, and the depth of the channels 162 is reduced.

The method for forming the channels 162 is similar to the method of formation that was described with reference to FIGS. 11A and 11B. First, once the metal plate 112 has been mounted and secured in place in a die 170, the steps for carving the surface on one side of the metal plate 112 are carried out repeatedly using the carving tool 130, whereby the numerous fins 161 are formed having a prescribed height and the channels 162 are formed between the fins 161, as shown in FIG. 24A.

The tops of the fins 161 formed on the surface on one side of the metal plate 112 are then cut off by, e.g., a grinder 133 or another cutting tool, forming the flat surfaces 161a on the ends of the fins 161, as shown in FIG. 24B. The height of the fins 161 is established so that the flat surfaces 161a on the ends contact an inner surface portion 163a with a slight pressure when the crowning member 163 has been placed on top. The crowning member 163 and the main-body plate 160A of the package are fixed together by welding, brazing, bonding, or other fixing means. The numerous channels 162 are thus covered by the crowning member 163, wherefrom the cooling part 120 is constituted.

The tops of the fins 161 are thus cut off using the cutting tool 133 to form the flat surfaces 161a on the ends, whereby the package 160 can be made thinner, allowing thinner electrical component package to be formed even when the cooling part 120 is provided. The flat surfaces 161a are formed on the ends of the fins 161, whereby the flat surfaces 161a are joined to the inner surface portion 163a of the crowning member 163, and therefore the channels 162 are separated and the coolant fluid can be efficiently dispersed.

The numerous channels 162 in the present example were formed on the surface from which the convexity was removed, but the numerous channels 162 may also be formed in the convexity as was described with reference to FIG. 1.

Modified Example 3 of Embodiment B

Figure 25:
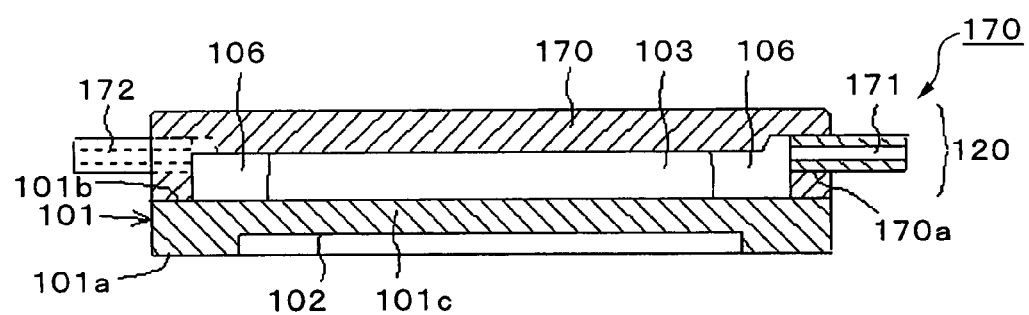
FIG. 25 is a cross-sectional view that shows a modified example of [the electrical component package] of FIG. 17.

FIG. 25 shows a modified example of the package 100 shown in FIGS. 17 through 19. The hollow, cylindrical flow inlet 107 and flow outlet 108 provided to the crowning member 105 in FIGS. 17 through 19 are provided to lateral surfaces of the crowning member 105 in FIG. 25. The same notation is applied to the components or structures of the package 170 shown in FIG. 25 that are the same as in FIGS. 17 through 19, and detailed descriptions of those components will be omitted.

In FIG. 25, a flow inlet 171 and a flow outlet 172 are provided to lateral surfaces of a crowning member 170 at locations that correspond to the fluid-accumulating parts 106a, 106b. Specifically, through-holes 170a are formed on lateral surfaces of the open dish-shaped crowning member 170 and communicate with the fluid-accumulating parts 106a, 106b. The flow inlet 171 and the flow outlet 172 that are composed of hollow, cylindrical pipe members are connected to the through-holes 170a. Sealing by welding, brazing, bonding, or other sealing means is preferably performed so that the coolant fluid does not flow out from between the through-holes 170a and the flow inlet 171 or flow outlet 172. The numerous channels 104 are covered by the crowning member 170, wherefrom the cooling part 120 is constituted.

An injection pipe, which is connected to means (not shown) for injecting coolant fluid, is inserted into the flow inlet 171 of the cooling part 120, and a fluid-removal pipe is inserted into the flow outlet 172. Coolant fluid introduced from the flow inlet 171 by means of the injection pipe accumulates in the fluid-accumulating part 106b before circulating through the numerous channels 104 and then accumulates in the fluid-accumulating part 106a near the flow outlet 172 before being discharged from the flow outlet 172 via the removal pipe. Heat generated from the electrical component housed in the concavity 102 of the package 100 at that point is cooled by the coolant fluid circulating within the channels 104, minimizing temperatures increases in the electrical component.

Modified Example 4 of Embodiment B

Figure 26:
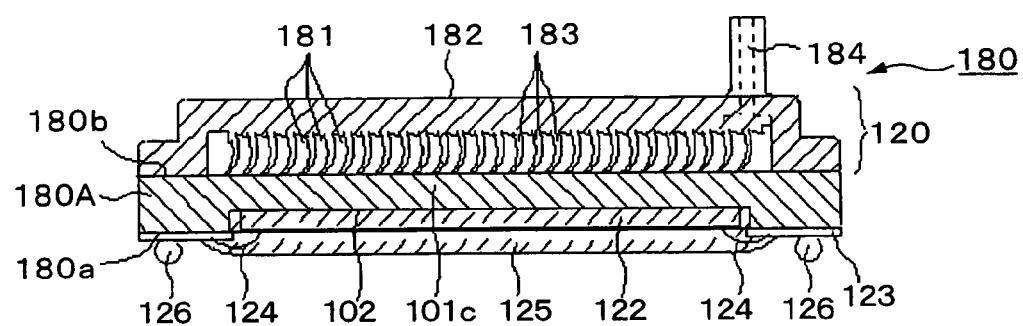
FIG. 26 is a cross-sectional view that shows a modified example of [the electrical component package] of FIG. 17.

FIG. 26 shows an example wherein the channels are formed on the inner surface portion of the crowning member, wherefrom the cooling part is constituted. In FIG. 26, a convexity 180a is formed on one surface of the main-body plate 180A of the package, while the other surface 180b is flat. A crowning member 182 is formed from a metal plate made of the same material as the main-body plate 180A of the package. The crowning member 182 is also formed into a shape substantially in the form of a dish like the crowning member described previously. Numerous plate-shaped fins 183 are formed on the inner surface of the crowning member 182 at prescribed intervals, and channels 181 that have fine widths through which the coolant fluid can move by capillary action are formed between the fins 183. The fins 183 and the channels 181 are formed as in the previously described method for forming the fins and channels on the other surface of the package, and therefore a description of that method will be omitted.

The crowning member 182 is formed into a shape substantially in the form of a dish after the fins 183 and the channels 181 have been formed on the flat metal plate. A hollow, cylindrical flow inlet 184 and a flow outlet are formed integrally protruding at locations that correspond to the fluid-accumulating parts so as to communicate with the fluid-accumulating parts, as described previously. The flow inlet 184 and the flow outlet are formed by, e.g., burring or another suitable means.

The crowning member 182 is placed upon the surface 180b of the main-body plate 180A of the package, and the edge of the opening of the crowning member 182 and the surface 180b of the main-body plate 180A of the package are fixed together by welding, brazing, bonding or other fixing means. The cooling part 120 can thus be configured so that the numerous channels 104 are covered by the crowning member 182.

As in the previously described example, heat generated from the IC chip 122 or other electrical component housed in the convexity 180a of the package 180 of the present example is transmitted to the opposing inner surface portion 180a via the main-body plate 180A of the package. The heat on this surface is cooled by the coolant fluid circulating within the channels 181 in the cooling part 120, minimizing temperature increases in the IC chip 122.

Modified Example 5 of Embodiment B

Figure 27A:
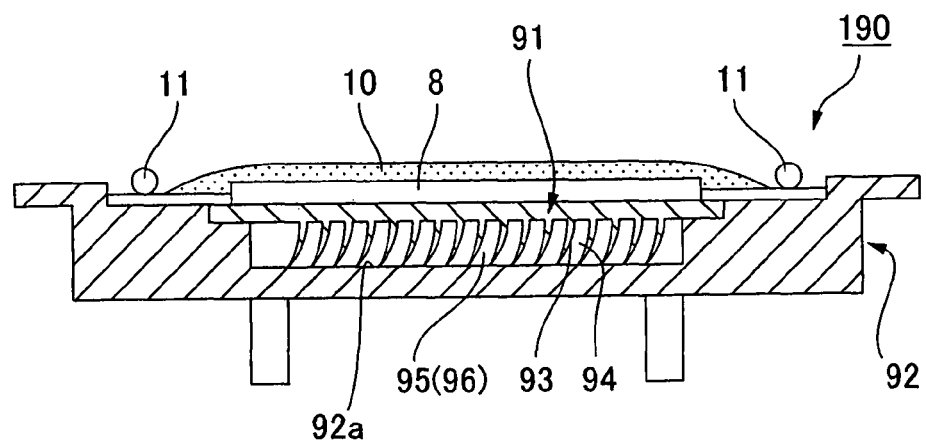
FIGS. 27A and 27B are cross-sectional views that show a modified example of the electrical component package of FIG. 17.
Figure 27B:
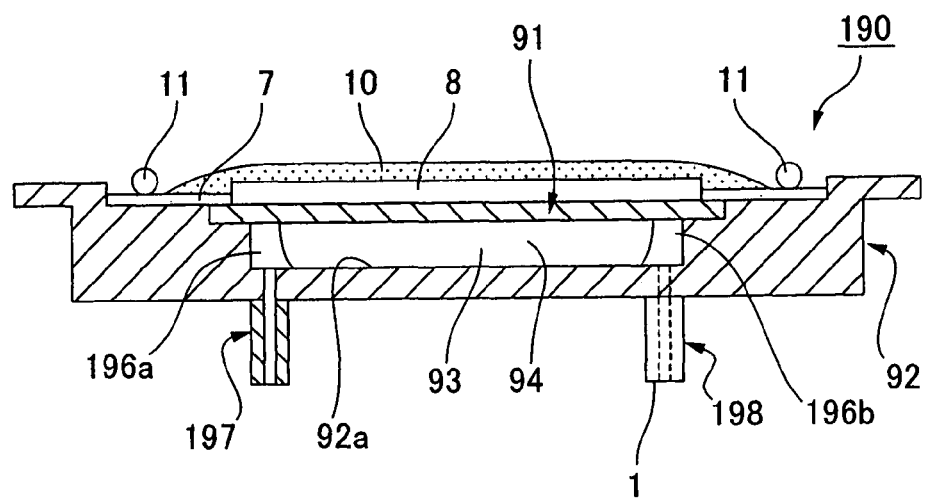
Figure 28A:
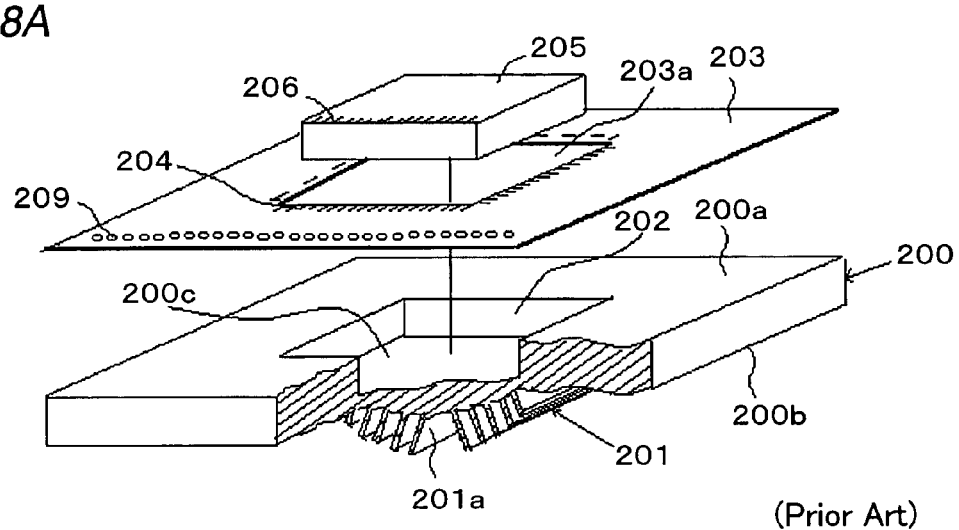
FIGS. 28A and 28B are a perspective view and a cross-sectional view that show a conventional electrical component package.
Figure 28B:
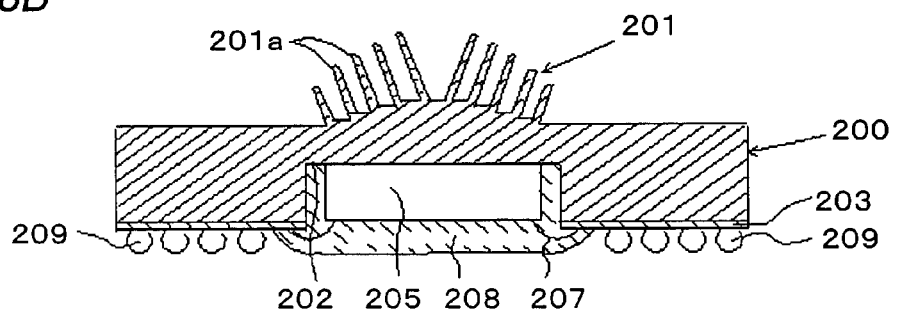

FIGS. 27A and 27B are cross-sectional views that show a modified example of embodiment B. The basic configuration of a package 190 of the present example is identical to modified example 4 of embodiment A shown in FIGS. 16A, 16B, and therefore the same notation will be applied to corresponding parts, the descriptions of which will be omitted.

In the package 190 of the present example, the ends of the fins 93 are in contact with the bottom surface portion 92a of the convexity of the second plate member 92, and the channels 94 that have extremely narrow widths are formed partitioned by the fins 93.

The length of the fins 93 is less than the width of the hollow part 95. A flow-inlet communicating part 196a that communicatingly connects the ends of the channels 94 is formed on one side of the hollow part 95, and a flow-outlet communicating part 196b that communicatingly connects the other ends of the channels 94 is formed on the other side.

A flow inlet 197 and a flow inlet 198 are provided to the outer surface of the second plate member 92 and are communicatingly connected to the flow-inlet communicating part 196a and the flow-outlet communicating part 196b, respectively. An injection pipe, which is connected to means (not shown) for injecting coolant fluid, is connected to the flow inlet 197, and a fluid removal pipe is connected to the flow outlet 108.

The first plate member 91 and the second plate member 92 of the package 190 having this configuration can be easily assembled.

Other Embodiments

In the embodiments above, the carving tool was moved while the metal plate was fixed in position, whereby the fins were raised and the channel parts were formed, but alternatively, the carving tool may be fixed and the fins may be formed by moving the metal plate, or the fins may be raised by moving the metal plate and the carving tool relative to one another.

Additionally, the channels were formed in the main-body plate of the package (the first plate member) or in the crowning member (the second plate member), but the channels may also be formed in both plate members so as to be divided and facing each other.

What is claimed is:

1. A component package having a heat exchanger, comprising:
    a first plate member;
    a second plate member placed on top of an inner surface portion of the first plate member, the first plate member and the second plate member being metal plates;
    a heat-exchanging hollow part formed between the first plate member and the second plate member, the hollow part being formed in a sealed state;
    plate-shaped fins formed integrally at prescribed intervals on the inner surface portion of the first plate member by carving out the inner surface portion which faces into the hollow part, the fins having spaces between the fins that function as channels for circulating a heat-exchanging working fluid;
    an outer concavity for mounting a component subjected to heat exchange, the outer concavity being formed as a component-mounting part by pressing the first plate member in an out-of-plane direction and being formed on an outer surface portion of the first plate member which is disposed opposite to the inner surface portion of the first plate member;
    a frame-shaped first flat-surface portion surrounding the inner surface portion of the first plate member, the frame-shaped first flat-surface portion being formed on the first plate member;
    an inner concavity for forming the hollow part; and
    a frame-shaped second flat-surface portion for encircling an outer circumference of the concavity formed on the second plate member, the first and second flat-surface portions being joined together,
    wherein the fins are formed by carving out a convexity that is formed using a press to protrude from the inner surface portion of the first plate member and has a size corresponding to the outer concavity, and
    the fins are formed in an area of the inner surface portion of the first plate member that is substantially vertically aligned to the outer concavity, portions of the first plate member between the fins and the outer concavity being thinner than the other portions of the first plate member.

2. The component package according to claim 1, wherein cross sections of bottom parts of the channels have a substantially rectangular shape in which at least one corner is an acute angle, and
    a width of the bottom parts of the channels is 0.01 to 1.0 mm.

3. The component package according to claim 1, wherein the working fluid is sealed within the hollow part.

4. A component package having a heat exchanger, comprising:
    a first plate member;

a second plate member placed on top of an inner surface portion of the first plate member, the first plate member and the second plate member being metal plates;

a heat-exchanging hollow part formed between the first plate member and the second plate member, the hollow part being formed in a sealed state;

plate-shaped fins formed integrally at prescribed intervals on the inner surface portion of the first plate member by carving out the inner surface portion which faces into the hollow part, the fins having spaces between the fins that function as channels for circulating a heat-exchanging working fluid;

an outer concavity for mounting a component subjected to heat exchange, the outer concavity being formed as a component-mounting part by pressing the first plate member in an out-of-plane direction and being formed on an outer surface portion of the first plate member which is disposed opposite to the inner surface portion of the first plate member;

a frame-shaped first flat-surface portion surrounding the inner surface portion of the first plate member, the frame-shaped first flat-surface portion being formed on the first plate member;

an inner concavity for forming the hollow part; and a frame-shaped second flat-surface portion for encircling an outer circumference of the concavity formed on the second plate member, the first and second flat-surface portions being joined together, wherein a convexity formed by using a press to protrude the inner surface portion of the first plate member is cut off to make a flat surface and the fins are formed by carving out the flat surface, and the fins are formed in an area of the inner surface portion of the first plate member that is substantially vertically aligned to the outer concavity, portions of the first plate member between the fins and the outer concavity being thinner than the other portions of the first plate member.

5. The component package according to claim 4, wherein distal end portions of the fins are cut to the same height as the frame-shaped first flat-surface portion that surrounds the fins.

6. The component package according to claim 4, wherein cross-sections of bottom parts of the channels have an substantially rectangular shape in which at least one corner is an acute angle, and a width of the bottom parts of the channels is 0.01 to 1.0 mm.

7. The component package according to claim 4, wherein the working fluid is sealed within the hollow part.

* * * * *